(12) United States Patent
Veerasamy et al.

(10) Patent No.: US 6,447,891 B1
(45) Date of Patent: *Sep. 10, 2002

(54) LOW-E COATING SYSTEM INCLUDING PROTECTIVE DLC

(75) Inventors: Vijayen S. Veerasamy, Farmington Hills; Rudolph Hugo Petrmichl, Ann Arbor; Scott V. Thomsen, Milford, all of MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/698,126

(22) Filed: Oct. 30, 2000

Related U.S. Application Data

(63) Continuation-in-part of application No. 09/303,548, filed on May 3, 1999, now Pat. No. 6,261,693, and a continuation-in-part of application No. 09/442,805, filed on Nov. 18, 1999, now Pat. No. 6,338,901, and a continuation-in-part of application No. 09/583,862, filed on Jun. 1, 2000, now Pat. No. 6,335,086, and a continuation-in-part of application No. 09/617,815, filed on Jul. 17, 2000, now Pat. No. 6,312,808.

(51) Int. Cl.[7] ............................................. B32B 17/06
(52) U.S. Cl. ...................... 428/216; 428/336; 428/408; 428/446; 428/469; 428/472; 428/698
(58) Field of Search ................ 428/408, 472, 428/469, 446, 698, 216, 336

(56) References Cited

U.S. PATENT DOCUMENTS

| | | |
|---|---|---|
| 3,959,577 A | 5/1976 | Frink |
| 4,060,660 A | 11/1977 | Carlson et al. |
| 4,263,350 A | 4/1981 | Valimont |
| 4,400,410 A | 8/1983 | Green et al. |
| 4,495,263 A | 1/1985 | Vandervalk |
| 4,504,519 A | 3/1985 | Zelez |

(List continued on next page.)

FOREIGN PATENT DOCUMENTS

| | | |
|---|---|---|
| NL | 8800607 | 10/1989 |
| WO | WO 86/00093 | 1/1986 |
| WO | WO 89/08856 | 9/1989 |
| WO | WO 04/12680 | 6/1994 |
| WO | WO 98/26926 | 6/1998 |
| WO | WO 98/45847 | 10/1998 |
| WO | WO 00/56127 | 9/2000 |
| WO | WO 01/36342 | 5/2001 |

OTHER PUBLICATIONS

US 4,960,645, 10/1990, Lingle et al. (withdrawn)
U.S. Patent Application Ser. No. 09/303,548, filed May 3, 1999.
U.S. Patent Application Ser. No. 09/442,805, filed Nov. 18, 1999.
U.S. Patent Application Ser. No. 09/583,862, filed Jun. 1, 2000.
U.S. Patent Application Ser. No. 09/617,815, filed Jul. 17, 2000.
"6001 Chemical Abstracts", Columbus, Ohio (1996) 1pg.

(List continued on next page.)

*Primary Examiner*—Archene Turner
(74) *Attorney, Agent, or Firm*—Nixon & Vanderhye P.C.

(57) ABSTRACT

A substrate is coated with a low-E coating system including at least one infrared (IR) reflective layer. A diamond-like carbon (DLC) inclusive protective coating system (e.g., including at least one highly tetrahedral amorphous carbon (ta-C) inclusive layer having $sp^3$ carbon-carbon bonds) is provided on the substrate over at least the IR reflective layer in order to make the low-E coating system scratch resistant, abrasion resistant, and generally mechanically durable. The DLC inclusive protective coating system may be hydrophobic, hydrophillic, or neutral in different embodiments of the invention. Optionally, at least one fluoro-alkyl silane (FAS) compound inclusive layer may be provided on the substrate over at least one of the DLC inclusive layer(s) in hydrophobic embodiments in order to increase contact angle θ of the coated article.

57 Claims, 10 Drawing Sheets

U.S. PATENT DOCUMENTS

| | | |
|---|---|---|
| RE32,272 E | 10/1986 | Funaki et al. |
| 4,666,802 A | 5/1987 | Hung et al. |
| 4,746,538 A | 5/1988 | Mackowski |
| 4,777,090 A | 10/1988 | Ovshinsky et al. |
| 4,806,220 A | 2/1989 | Finley |
| 4,816,291 A | 3/1989 | Desphandey et al. |
| 4,877,677 A | 10/1989 | Hirochi et al. |
| 4,898,789 A | 2/1990 | Finley |
| 4,935,303 A | 6/1990 | Ikoma et al. |
| 4,965,156 A | 10/1990 | Hotomi et al. |
| 5,000,831 A | 3/1991 | Osawa et al. |
| 5,028,759 A | 7/1991 | Finley |
| 5,098,737 A | 3/1992 | Collins et al. |
| 5,122,249 A | 6/1992 | Niemann et al. |
| 5,135,808 A | 8/1992 | Kimock et al. |
| 5,143,963 A | 9/1992 | Sterling et al. |
| 5,188,887 A | 2/1993 | Linge et al. |
| 5,190,807 A | 3/1993 | Kimock et al. |
| 5,214,008 A | 5/1993 | Beckwith et al. |
| 5,229,194 A | 7/1993 | Lingle et al. |
| 5,240,886 A | 8/1993 | Gulotta et al. |
| 5,242,560 A | 9/1993 | Lingle et al. |
| 5,250,322 A | 10/1993 | Takahashi et al. |
| 5,268,217 A | 12/1993 | Kimock et al. |
| 5,294,252 A | 3/1994 | Gun |
| 5,298,048 A | 3/1994 | Lingle et al. |
| 5,328,768 A | 7/1994 | Goodwin |
| 5,344,718 A | 9/1994 | Hartig et al. |
| 5,352,493 A | 10/1994 | Dorfman et al. |
| 5,376,455 A | 12/1994 | Hartig et al. |
| 5,378,527 A | 1/1995 | Nakanishi et al. |
| 5,385,872 A | 1/1995 | Gulotta et al. |
| 5,401,316 A | 3/1995 | Shiraishi et al. |
| 5,415,297 A | 5/1995 | Hirayama et al. |
| 5,415,927 A | 5/1995 | Hirayama et al. |
| 5,419,969 A | 5/1995 | Miyazaki et al. |
| 5,425,861 A | 6/1995 | Hartig et al. |
| 5,425,983 A | 6/1995 | Propst et al. |
| 5,435,900 A | 7/1995 | Gorokhovsky |
| 5,437,894 A | 8/1995 | Ogawa et al. |
| 5,455,081 A | 10/1995 | Okada et al. |
| 5,470,661 A | 11/1995 | Bailey et al. |
| 5,474,816 A | 12/1995 | Falabella |
| 5,506,038 A | 4/1996 | Knapp et al. |
| 5,507,987 A | 4/1996 | Windischmann |
| 5,508,092 A | 4/1996 | Kimock et al. |
| 5,508,368 A | 4/1996 | Knapp et al. |
| 5,510,186 A | 4/1996 | Suizbach |
| 5,514,476 A | 5/1996 | Hartig et al. |
| 5,518,780 A | 5/1996 | Tamor et al. |
| 5,527,559 A | 6/1996 | Simpson |
| 5,527,596 A | 6/1996 | Kimock et al. |
| 5,547,714 A | 8/1996 | Huck et al. |
| 5,557,462 A | 9/1996 | Hartig et al. |
| 5,580,605 A | 12/1996 | Ogawa et al. |
| 5,612,262 A | 3/1997 | Kloss et al. |
| 5,614,574 A | 3/1997 | Sheth |
| 5,616,179 A | 4/1997 | Baldwin et al. |
| 5,620,745 A | 4/1997 | Simpson |
| 5,624,718 A | 4/1997 | Dearnaley |
| 5,629,532 A | 5/1997 | Myrick |
| 5,635,245 A | 6/1997 | Kimock et al. |
| 5,635,258 A | 6/1997 | Chen et al. |
| 5,637,353 A | 6/1997 | Kimock et al. |
| 5,643,423 A | 7/1997 | Kimock et al. |
| 5,653,812 A | 8/1997 | Petrmichl et al. |
| 5,679,269 A | 10/1997 | Cohen et al. |
| 5,679,446 A | 10/1997 | Windischmann |
| 5,688,585 A | 11/1997 | Lingle et al. |
| 5,688,864 A | 11/1997 | Goodwin |
| 5,718,976 A | 2/1998 | Dorfman et al. |
| 5,731,046 A | 3/1998 | Mistry et al. |
| 5,736,476 A | 4/1998 | Watzke et al. |
| 5,747,118 A | 5/1998 | Bunshah et al. |
| 5,762,715 A | 6/1998 | Patten, Jr. et al. |
| 5,763,064 A | 6/1998 | Suzuki et al. |
| 5,770,321 A | 6/1998 | Hartig et al. |
| 5,776,103 A | 7/1998 | Zagdoun et al. |
| 5,776,553 A | 7/1998 | Jaffe et al. |
| 5,776,600 A | 7/1998 | Katayama et al. |
| 5,776,612 A | 7/1998 | Fisher |
| 5,776,845 A | 7/1998 | Boulos et al. |
| 5,776,846 A | 7/1998 | Sakaguchi et al. |
| 5,783,260 A | 7/1998 | Kato et al. |
| 5,783,309 A | 7/1998 | Faure et al. |
| 5,792,254 A | 8/1998 | Windischmann |
| 5,795,648 A | 8/1998 | Goel et al. |
| 5,798,139 A | 8/1998 | Nagashima et al. |
| 5,800,918 A | 9/1998 | Chartier et al. |
| 5,800,933 A | 9/1998 | Hartig et al. |
| 5,824,374 A | 10/1998 | Bradley, Jr. et al. |
| 5,830,332 A | 11/1998 | Babich et al. |
| 5,830,812 A | 11/1998 | Shelestak et al. |
| 5,837,108 A | 11/1998 | Lingle et al. |
| 5,837,357 A | 11/1998 | Matsuo et al. |
| 5,844,225 A | 12/1998 | Kimock et al. |
| 5,846,613 A | 12/1998 | Neuville |
| 5,846,649 A | 12/1998 | Knapp et al. |
| 5,849,228 A | 12/1998 | Patton, Jr. et al. |
| 5,849,413 A | 12/1998 | Zhu et al. |
| 5,851,940 A | 12/1998 | Boulos et al. |
| 5,855,641 A | 1/1999 | Taniguchi |
| 5,856,016 A | 1/1999 | Takahashi et al. |
| 5,858,477 A | 1/1999 | Veerasamy et al. |
| 5,858,894 A | 1/1999 | Nagashima et al. |
| 5,858,896 A | 1/1999 | Nagashima et al. |
| 5,863,605 A | 1/1999 | Bak-Boychuk et al. |
| 5,873,921 A | 2/1999 | Hiroth et al. |
| 5,876,753 A | 3/1999 | Timmons et al. |
| 5,877,103 A | 3/1999 | Dupont et al. |
| 5,879,775 A | 3/1999 | Walter et al. |
| 5,880,552 A | 3/1999 | McGill et al. |
| 5,888,593 A | 3/1999 | Petrmichl et al. |
| 5,900,342 A | 5/1999 | Visser et al. |
| 5,902,505 A | 5/1999 | Finley |
| 5,939,140 A | 8/1999 | Jang et al. |
| 5,958,601 A | 9/1999 | Salsman |
| 5,958,996 A | 9/1999 | Egitto et al. |
| 5,965,216 A | 10/1999 | Neuberger et al. |
| 5,965,629 A | 10/1999 | Jung et al. |
| 5,976,683 A | 11/1999 | Liehrr et al. |
| 5,989,693 A | 11/1999 | Yamasaki et al. |
| 5,997,943 A | 12/1999 | Azzopardi et al. |
| 6,001,431 A | 12/1999 | Itoh et al. |
| 6,002,208 A | 12/1999 | Maishev et al. |
| 6,046,758 A | 4/2000 | Brown et al. |
| 6,261,693 B1 | 7/2001 | Veerasamy |
| 6,277,480 B1 | 8/2001 | Veerasamy et al. |
| 6,280,834 B1 | 8/2001 | Veerasamy et al. |
| 6,284,377 B1 | 9/2001 | Veerasamy |
| 6,303,225 B1 | 10/2001 | Veerasamy |
| 6,303,226 B2 | 10/2001 | Veerasamy |
| 6,312,808 B1 | 11/2001 | Veerasamy et al. |
| 6,335,086 B1 | 1/2002 | Veerasamy |
| 6,338,901 B1 | 1/2002 | Veerasamy |
| 2001/0028956 A1 | 10/2001 | Veerasamy et al. |

OTHER PUBLICATIONS

"Highly Tetrahedral, Diamond–Like Amorphous Hydrogenated Carbon Prepared From a Plasma Beam Source", Sattel et al., Published Feb. 1994 pp. 2797–2799.

"Deposition of Carbon Films by a Filtered Cathodic Arc", Kuhn et al., Jan. 1993, pp. 1350–1354.

"Electronic Density of States in Highly Tetrahedral Amorphous Carbon", Veerasamy et al., Aug. 1993, pp. 319–326.–

"Preparation and Properties of Highly Tetrahedral Hydrogenated Amorphous Carbon", Weiler et al., Jan. 1996, pp. 1594–1607.

"Optical and Electronic Properties of Amorphous Diamond", Veerasamy et al., Feb. 1993, pp. 782–787.

"IBM Tech. Bulletin", vol. 36, No. 3 (1993) 1pg.

"IBM Tech. Bulletin", vol. 36, No. 1 (1993) 1pg.

"Tetrahedral Amorphous Carbon Deposition, Characterisation and Electrode Properties" by Veerasamy, Univ. of Cambridge, Jul., 1994.

"ANSI Z26.1", Society of Automotive Engineers, American National Standards Institute, Inc., 1977.

"The Fracturing of Glass " by Michalske, et. al.

| Cycle # | Sputter time Seconds | Depth (SiO2) Å | Atomic Concentration % | | | SUM |
|---|---|---|---|---|---|---|
| | | | C | O | Si | |
| 1 | 0 | 0 | 92.5 | 5.7 | 1.7 | 100 |
| 2 | 16 | 6 | 96.4 | 1.8 | 1.9 | 100 |
| 3 | 32 | 12 | 96.2 | 1.9 | 1.9 | 100 |
| 4 | 62 | 23 | 95.8 | 1.4 | 2.8 | 100 |
| 5 | 92 | 34 | 95.9 | 1.2 | 2.9 | 100 |
| 6 | 122 | 45 | 94.7 | 1.7 | 3.6 | 100 |
| 7 | 222 | 82 | 89.6 | 2.7 | 7.7 | 100 |
| 8 | 322 | 119 | 83.1 | 3.3 | 13.6 | 100 |
| 9 | 422 | 156 | 76.6 | 4.4 | 19.0 | 100 |
| 10 | 522 | 193 | 70.5 | 4.4 | 25.2 | 100 |
| 11 | 622 | 230 | 68.1 | 4.7 | 27.2 | 100 |
| 12 | 722 | 267 | 66.8 | 4.7 | 28.5 | 100 |
| 13 | 822 | 304 | 62.5 | 7.1 | 30.5 | 100 |
| 14 | 922 | 341 | 45.1 | 23.1 | 31.7 | 100 |
| 15 | 1022 | 378 | 11.1 | 54.0 | 34.9 | 100 |
| 16 | 1122 | 415 | 0 | 65.9 | 34.1 | 100 |
| 17 | 1222 | 452 | 0 | 66.1 | 33.9 | 100 |
| 18 | 1322 | 489 | 0 | 65.9 | 34.1 | 100 |
| 19 | 1422 | 526 | 0 | 66.1 | 33.9 | 100 |

FIG. 8

| Cycle # | Sputter time Seconds | Depth (SiO2) Å | Atomic Concentration % | | | SUM |
|---|---|---|---|---|---|---|
| | | | C | O | Si | |
| 1 | 0 | 0 | 72.2 | 17.7 | 10.0 | 100 |
| 2 | 16 | 8 | 83.1 | 7.2 | 9.7 | 100 |
| 3 | 32 | 15 | 82.3 | 4.1 | 13.5 | 100 |
| 4 | 48 | 23 | 81.2 | 4.9 | 13.9 | 100 |
| 5 | 64 | 31 | 79.4 | 5.2 | 15.4 | 100 |
| 6 | 80 | 38 | 75.9 | 5.6 | 18.5 | 100 |
| 7 | 96 | 46 | 74.0 | 8.5 | 17.4 | 100 |
| 8 | 112 | 54 | 68.9 | 10.8 | 20.2 | 100 |
| 9 | 128 | 61 | 64.2 | 13.9 | 22.0 | 100 |
| 10 | 144 | 69 | 58.7 | 17.8 | 23.5 | 100 |
| 11 | 160 | 77 | 49.4 | 23.2 | 27.4 | 100 |

FIG. 9

LOW-E COATING SYSTEM INCLUDING PROTECTIVE DLC

This is a continuation-in-part (CIP) of U.S. patent application Ser. No. 09/303,548, filed May 3, 1999 (U.S. Pat. No. 6,261,693), and a continuation-in-part (CIP) of U.S. patent application Ser. No. 09/442,805, filed Nov. 18, 1999 (U.S. Pat. No. 6,338,901), and a continuation-in-part (CIP) of U.S. patent application Ser. No. 09/583,862 filed Jun. 1, 2000, entitled "Hydrophobic Coating Including DLC on Substrate" (U.S. Pat. No. 6,335,086), and a CIP of U.S. patent application Ser. No. 09/617,815, filed Jul. 17, 2000, entitled "Hydrophobic Coating with DLC & FAS on Substrate" (U.S. Pat. No. 6,312,808), the disclosures of which are all hereby incorporated herein by reference.

LOW-E COATING SYSTEM INCLUDING PROTECTIVE DLC

This invention relates to a low emissivity (low-E) coating system including diamond-like carbon (DLC) provided on (directly or indirectly) a substrate of glass, plastic, ceramic, or the like, and a method of making the same.

BACKGROUND OF THE INVENTION

Sputter coated systems for deposition on glass are known in the art for achieving solar management properties in glass articles such as insulating glass (IG) windows, vehicle windows, and the like. In many such coating systems, it is desirable to provide a coating system capable of:(i) reflecting a certain amount of infrared (IR) radiation, while (ii) allowing an acceptable amount of visible light transmittance, and (iii) limiting the amount of visible light reflectance off of the coating system.

Exemplary low-E coating systems are disclosed in U.S. Pat. Nos. 5,800,933; 5,770,321; 5,419,969; and 5,344,718, the disclosures of which are all hereby incorporated herein by reference.

Unfortunately, many conventional low-E coating systems are prone to scratching. Thus, they are not as abrasion resistant as would be desired. Because of this potential for scratching, many low-E coating systems are not typically utilized in applications such as rear vehicle windows (e.g., back seat vehicle windows, vehicle backlites, etc.). Instead, such windows are often tinted in order to keep IR rays out of the vehicle (which also has the effect of reducing visibility in certain circumstances).

U.S. Pat. No. 5,976,683 discloses a coating system having high transmissivity in the visible spectrum and high reflectivity in the thermal radiation spectrum. A polycrystalline carbon layer crystallized with a diamond structure and doped with foreign atoms is provided and formed via CVD. Unfortunately, such polycrystalline layers are difficult and expensive to deposit on substrates and typically require very high temperatures during the deposition process (e.g., from 700 to 1,000 degrees C.). If one attempted to elevate a substrate including a low-E coating system thereon to such temperatures, many such low-E systems would be destroyed or significantly damaged. Thus, the use of a polycrystalline diamond layer formed in such a manner over a low-E system is neither practical nor desirable.

In view of the above, it will be apparent to those skilled in the art that there exists a need in the art for an improved scratch resistant and/or mechanically durable low-E coating system for use in automotive and/or architectural window applications. There also exists a need in the art for a low-E coating system that can repel water and/or dirt, and a method of making the same. There also exists a need in the art for a low-E coating system including a protective layer(s) system that can be deposited over underlying low-E layers via a low temperature process.

It is a purpose of different embodiments of this invention to fulfill any or all of the above described needs in the art, and/or other needs which will become apparent to the skilled artisan once given the following disclosure.

SUMMARY OF THE INVENTION

An object of this invention is to provide a low-E coating system that is scratch resistant and mechanically durable.

Another object of this invention is to provide a diamond-like carbon (DLC) inclusive protective layer(s) or coating system located over a low-E layer arrangement, wherein the DLC inclusive protective layer(s) or coating system can be deposited in or via a low temperature process so as to not significantly damage the existing or underlying low-E layer arrangement.

Another object of this invention is to provide a low-E coating system that is (i) scratch resistant and mechanically durable, (ii) capable of reflecting an acceptable amount of infrared (IR) radiation, (iii) capable of allowing an acceptable amount of visible light transmittance, and (iv) capable of limiting the amount of visible light reflectance off of the coating system.

While non-hydrophobic low-E coating systems are often desirable, there also sometimes exists a need in the art for a low-E coating system that may be hydrophobic (i.e., can shed or repel water) if desired. Thus, another object of this invention is to provide low-E coating systems that are hydrophobic, as well as low-E coating systems that need not be hydrophobic.

Another object of this invention is to provide a scratch resistant low-E coating system including at least one diamond-like carbon (DLC) inclusive layer having at least some highly tetrahedral amorphous carbon (ta-C), wherein the ta-C includes $sp^3$ carbon-carbon bonds so as to make the layer more scratch resistant and mechanically durable.

In certain embodiments, a low-E coating system may include each of a DLC inclusive layer(s) and a fluoro-alkyl silane (FAS) compound inclusive layer, wherein the DLC is provided for durability purposes and the FAS for increasing the contact angle θ of the coating system.

Another object of certain embodiments of this invention is to provide a low-E coating system including $sp^3$ carbon-carbon bonds and FAS, the low-E coating system having a wettability W with regard to water of less than or equal to about 23 mN/m, more preferably less than or equal to about 21 mN/m, even more preferably less than or equal to about 20 mN/m, and in most preferred embodiments less than or equal to about 19 mN/meter. This can also be explained or measured in Joules per unit area ($mJ/m^2$)

Another object of this invention is to provide a low-E coating system having a surface energy $\gamma_C$ (on the surface of the coated article) of less than or equal to about 20.2 mN/m, more preferably less than or equal to about 19.5 mN/m, and most preferably less than or equal to about 18 mN/m.

Another object of this invention is to provide a low-E coating system having an initial (i.e. prior to. being exposed to environmental tests, rubbing tests, acid tests, UV tests, or the like) water contact angle θ of at least about 55 degrees, more preferably of at least about 80 degrees, still more preferably of at least about 100 degrees, even more preferably of at least about 110 degrees, and most preferably of at least about 125 degrees.

Another object of this invention is to manufacture a low-E coating system including at least one DLC inclusive layer, wherein the DLC inclusive layer is deposited in a manner such that during the deposition process the underlying substrate and/or IR reflecting layer (e.g., Ag layer) may be kept at temperature(s) no greater than about 200° C., preferably no greater than about 150° C., most preferably no greater than about 80° C., so as to reduce the likelihood of heat-induced damage to portions of the low-E coating system.

Yet another object of this invention is to fulfill any and/or all of the aforesaid objects and/or needs.

This invention will now be described with respect to certain embodiments thereof, along with reference to the accompanying illustrations.

IN THE DRAWINGS

FIG. 8 is a chart illustrating the atomic amounts of carbon, oxygen, and silicon (relative only to one another) at different thicknesses of the two DLC inclusive layers of the FIG. 2 coating system (i.e., without an overlying FAS inclusive layer).

FIG. 9 is a chart illustrating the atomic amounts of carbon, oxygen, and silicon (relative only to one another) at different thicknesses of the FAS portion of a sample coating system in accordance with the FIG. 2(a) embodiment of this invention; so FIGS. 8–9 can be used together to illustrate a complete coating system including both DLC and FAS inclusive layers of the FIG. 2(a) embodiment.

DETAILED DESCRIPTION OF CERTAIN EMBODIMENTS OF THIS INVENTION

Figure 1:
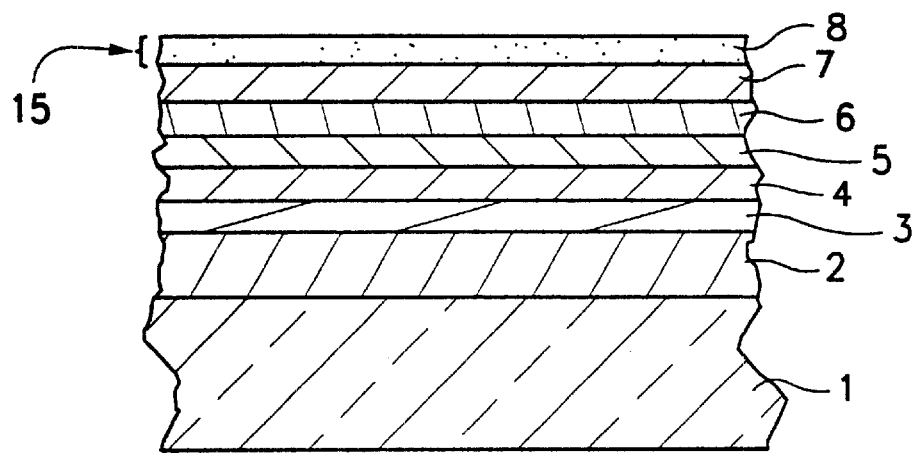
FIG. 1 is a side cross sectional view of a coated article according to an embodiment of this invention, wherein a substrate is provided with a low-E coating system thereon including a DLC inclusive protective layer.

Referring now more particularly to the accompanying drawings in which like reference numerals indicate like elements throughout the accompanying views.

FIG. 1 is a side cross sectional view of a substrate provided with a low-E coating system thereon according to an embodiment of this invention. The product includes underlying substrate 1 of glass, ceramic or plastic (preferably soda-lime-silica float glass from about 1.5 to 6 mm thick), substantially transparent dielectric layer 2 (e.g., of or including silicon nitride, silicon oxynitride, $SiO_2$, $TiO_2$, PbO, $Bi_2O_3$, or any mixture thereof), substantially transparent dielectric layer 3 (e.g., of or including a nitride such as silicon nitride having a make-up of approximately $Si_3N_4$), first metal or metal oxide or metal nitride layer 4 (e.g., of or including Ni, Cr, NiCr, $NiCrO_x$, $NiCrN_x$ or any mixture thereof), metallic IR reflective layer 5 (e.g., of or including Ag), second metal or metal oxide or metal nitride layer 6 (e.g., of or including Ni, Cr, NiCr, $NiCrO_x$, $NiCrN_x$ or any mixture thereof), substantially transparent dielectric layer 7 (e.g., of or including a nitride such as silicon nitride having a make-up of approximately $Si_3N_4$), and diamond-like carbon (DLC) inclusive layer 8.

In an exemplary embodiment, the low-E coating system includes, from substrate 1 outwardly, titanium oxide (or dioxide) layer 2 about 200 angstroms (Å) thick, silicon nitride ($Si_3N_4$) layer 3 about 100 Å thick, NiCrO, layer 4 about 10 Å thick, silver (Ag) layer 5 about 85 Å thick, $NiCrO_x$ layer 6 about 10 Å thick, silicon nitride ($Si_3N_4$) layer 7 about 450 Å thick, and DLC inclusive layer(s) 8 as described in any embodiment of either of parent applications 09/303,548 (U.S. Pat. No. 6,261,693) or Ser. No. 09/442,805 (U.S. Pat. No. 6,338,901). Optionally, each of layers 3 and 7 may include about 1–2% stainless steel in certain embodiments.

DLC inclusive layer 8 is preferably substantially non-polymerized and substantially non-crystalline and makes up (either alone or in combination with another layer(s)) a protective DLC inclusive layer(s) or coating system 15 that is mechanically and chemically durable, scratch resistant, and protects the underlying portion (e.g., low-E arrangement of layers 2–7) of the low-E coating system. Thus, system 15 provides durability enhancement (e.g., scratch resistance) to the low-E coating system, while not substantially adversely affecting the low-E characteristics of the low-E coating system. As will be further explained below, protective coating system 15 may be a hydrophobic coating system in certain embodiments of this invention when hydrophobic properties are desired.

An advantage associated with certain embodiments of this invention is that DLC inclusive protective system 15 can be deposited or formed over low-E layer arrangement 2–7 via a low temperature deposition process (e.g., ion beam deposition as described below). For example, protective layer(s) system 15 can be deposited at temperatures no greater than about 200 degrees C., more preferably no greater than about 125 degrees C., even more preferably at temperatures no greater than about 75 degrees C., and most preferably at temperatures no greater than about 40 degrees C. (e.g., layer system 15 may be deposited at approximate room temperature in certain embodiments). These low temperatures are compared to the 700–1,000 degree C. temperatures typically required for depositing the non-amorphous polycrystalline diamond in the aforesaid '683 patent. As a result of the low temperatures used during the system 15 deposition process, the underlying low-E layers 2–7 are not significantly damaged during the deposition of protective layer system 15. Moreover, the amorphous DLC in layer 8 provides excellent durability and scratch resistance, and may be substantially transparent to visible light in certain embodiments.

In the FIG. 1 embodiment, DLC inclusive layer 8 may be made up of or include any of the DLC inclusive layers described and/or illustrated in the parent commonly owned U.S. Ser. No. 09/303,548, filed May 3, 1999 (U.S. Pat. No. 6,261,693), which is incorporated herein by reference, or the parent commonly owned U.S. Ser. No. 09/442,805, filed Nov. 18, 1999 (U.S. Pat. No. 6,338,901), incorporated herein by reference. Thus, DLC inclusive layer 8 preferably includes at least some amount of highly tetrahedral amorphous carbon (ta—C). Highly tetrahedral amorphous carbon (ta—C) forms $sp^3$ carbon-carbon bonds, and is a special form of diamond-like carbon (DLC). In certain embodiments of this invention, in DLC inclusive layer 8 at least about 40% (more preferably at least about 60%, and most preferably at least about 80%) of the carbon-carbon bonds are of the $sp^3$ carbon-carbon type. The remainder of the bonds in layer 8 may be, for example, $sp^2$ carbon-carbon bonds, Si—C bonds, C—O bonds, or the like. The provision of at least some $sp^3$ carbon-carbon bonds in layer 8 enables layer 8 to be more scratch resistant, hard, chemically resistant and substantially transparent. Layer 8, in certain embodiments, has a hardness of at least about 10 GPa, more preferably from about 25–80 GPa, due in large part to the presence of the $sp^3$ carbon-carbon bonds.

Substantially transparent dielectric layer 2 is optional, but when provided is preferably from about 100–500 Å thick, more preferably from about 150–300 Å thick. Substantially transparent dielectric layer 3 is preferably from about 20–200 Å thick, more preferably from about 20–120 Å thick. First metal or metal oxide or metal nitride layer 4 is preferably from about 7–50 Å thick, more preferably from about 7–30 Å thick. IR reflective layer 5 is preferably from about 50–250 Å thick, more preferably from about 100–200 Å thick. Second metal or metal oxide or metal nitride layer 6 is preferably from about 7–50 Å thick, more preferably from about 7–20 Å thick. Substantially transparent dielectric layer 7 is preferably from about 50–600 Å thick, more preferably from about 400–500 Å thick. Optionally, an additional metal oxide (e.g., $SnO_2$, ZnO, $In_2O_3$) inclusive layer (not shown) may be provided over layer 7 so as to be located between layers 7 and 8. In certain embodiments, DLC inclusive layer 8 may be from about 10 to 250 angstroms (A) thick, or any other thickness discussed in any of the parent applications.

The layers 2–7 of the low-E arrangement may be made up of or include any of the low-E coating systems disclosed and/or described in any of U.S. Pat. Nos. 5,800,933 or 5,770,321, both of which are hereby incorporated herein by reference. Alternatively, any other suitable low-E coating system may instead be used beneath the protective DLC IA) inclusive layer system 15. Exemplary thicknesses of layers 2–7 are provided in the '933 and/or '321 patents, as are exemplary materials which may be used for these layers.

Low-E performance characteristics of the low-E coating system of this invention are also provided in the '933 and/or '321 patents (the presence of substantially transparent protective system 15 does not substantially adversely affect the low-E characteristics of the underlying low-E portion of the system). For example, low-E coating systems herein preferably have a normal emissivity ($E_n$) of about 0.10 or less (more preferably about 0.06 or less), a hemispherical emissivity ($E_h$) of about 0.11 or less (more preferably about 0.07 or less), a sheet resistance ($R_s$) of about 10.0 ohms/square or less (more preferably of about 5.0 ohms/square or less), and a visible transmittance of at least about 70% (more preferably of at least about 75%). Additionally, low-E coating systems herein preferably have a substantially neutral visible reflectance color. Layers 2–7 may be deposited, preferably by sputtering, via any of the techniques discussed in the '933 and/or '321 patents, or using any other suitable technique in different embodiments of this invention.

Figure 2A:
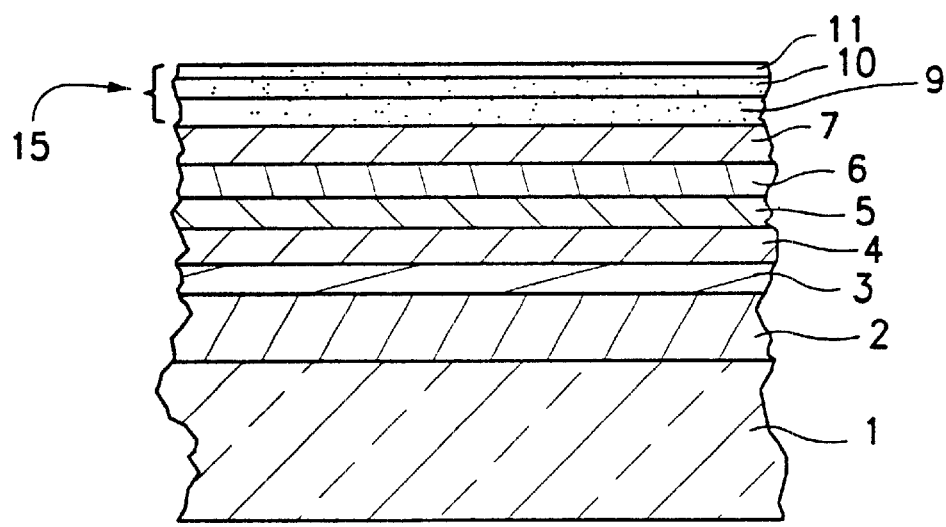
FIG. 2(a) is a side cross sectional view of a coated article according to another embodiment of this invention, wherein a substrate is provided with a low-E coating system thereon including a pair of DLC inclusive protective layers and a FAS compound inclusive layer.

FIG. 2(a) is a side cross sectional view of a coated article including a low-E coating system according to an embodiment of this invention, wherein a diamond-like carbon (DLC) and fluoro-alkyl silane (FAS) inclusive protective coating system 15 including at least three layers 9, 10 and 11 is provided on substrate 1 over the same low-E layers 2–7 described above and illustrated in FIG. 1. Referring to the FIG. 2(a) embodiment, substrate 1 may be of glass, plastic, ceramic, or the like. In certain embodiments, each of layers 9 and 10 of the protective coating system 15 portion of the low-E system includes at least some amount of highly tetrahedral amorphous carbon (ta-C). As mentioned above, highly tetrahedral amorphous carbon (ta-C) forms $sp^3$ carbon-carbon bonds, and is a special form of diamond-like carbon (DLC). DLC inclusive layers 9 and 10 are preferably substantially non-crystalline and/or substantially non-polymerized in certain embodiments of this invention. FAS inclusive layer 11 is then applied over layers 9, 10. Protective system 15 (to be deposited at the low temperatures described above) may function in a hydrophobic manner (i.e., it is characterized by high water contact angles θ and/or low surface energies as described below), and optionally may be characterized by low tilt angle(s) β in certain embodiments. In general, the DLC inclusive layer(s) 9 and/or 10 provide durability, scratch resistance and/or hydrophobicity, while FAS inclusive layer 11 functions to even further increase the contact angle θ of the protective coating system 15 if desired.

In the FIG. 2 embodiment(s), DLC inclusive coating/layer system 15 may comprise any of the DLC inclusive layer systems illustrated and/or described in one or both of parent applications 09/583,862 (U.S. Pat. No. 6,335,086) and/or Ser. No. 09/303,548 (U.S. Pat. No. 6,261,693), both of which are incorporated herein by reference.

It is surmised that the surface of DLC inclusive layer 10 includes highly reactive dangling bonds immediately after its formation/deposition, and that the application of FAS inclusive layer 11 onto the surface of layer 10 shortly after layer 10's formation enables tight binding and/or anchoring of FAS inclusive layer 11 to the surface of layer 10. This results in increased contact angle θ (improved hydrophobicity) and a durable low-E coating system. In certain embodiments of this invention, it has been found that FAS inclusive layer 11 bonds more completely to DLC inclusive layer 10 when FAS layer 11 is applied on the upper surface of layer 10 within one hour after layer 10 is formed, more preferably within thirty minutes after layer 10 is formed, and most preferably within twenty minutes after layer 10 is formed. Thus, a more durable coating system results when FAS inclusive layer 11 is applied on DLC inclusive layer 10 shortly after layer 10 is formed.

Overlying layer 11 may be substantially all FAS, or only partially FAS in different embodiments of this invention. Layer 11 preferably includes at least one compound having an FAS group. Generally speaking, FAS compounds generally comprise silicon atoms bonded to four chemical groups. One or more of these groups contains fluorine and carbon atoms, and the remaining group(s) attached to the silicon atoms are typically alkyl (hydrocarbon), alkoxy (hydrocarbon attached to oxygen), or halide (e.g., chlorine) group(s). Exemplary types of FAS for use in layer 11 include $CF_3(CH_2)_2Si(OCH_3)_3$ [i.e., 3, 3, 3 trifluoropropyl) trimethoxysilane]; $CF_3(CF_2)_5(CH_2)_2Si(OCH_2CH_3)_3$ [i.e., tridecafluoro-1, 1, 2, 2-tetrahydrooctyl-1-triethoxysilane]; $CF_3(CH_2)_2SiCl_3$; $CF_3(CF_2)_5(CH_2)_2SiCl_3$; $CF_3(CF_2)_7(CH_2)_2Si(OCH_3)_3$; $CF_3(CF_2)_5(CH_2)_2Si(OCH_3)_3$; $CF_3(CF_2)_7(CH_2)_2SiCl_3$; $CF_3(CF_2)_7(CH_2)_2SiCH_3Cl_2$; and/or $CF_3(CF_2)_7(CH_2)_2SiCH_3(OCH_3)_2$. These FAS material may be used either alone or in any suitable combination for layer 11. At least partial hydrolysate (hydrolysed) versions of any of these compounds may also be used. Moreover, it is noted that this list of exemplary FAS materials is not intended to be limiting, as other FAS type materials may also be used in layer 11. While FAS inclusive layer 11 is applied over layer 10 by physical rubbing (or buffing) in certain preferred embodiments of this invention, layer 11 could instead be applied in any other suitable manner in other embodiments of this invention. It certain embodiments, FAS inclusive layer 11 may be thermally cured as described below relative to FIG. 10.

Still referring to FIG. 2(a), according to certain embodiments of this invention, while DLC inclusive layers 9 and 10 each include DLC, the two layers are preferably deposited using different precursor or feedstock gases so that the two layers have different characteristics (e.g., different hardnesses and/or densities). In an exemplary embodiment, underlying or anchor DLC inclusive layer 9 is deposited using an ion beam deposition technique utilizing a TMS (tetramethylsilane) inclusive precursor or feedstock gas; while overlying DLC inclusive layer 10 is deposited using an ion beam deposition technique utilizing a $C_2H_2$ (acetylene) inclusive precursor or feedstock gas. It is believed that the underlying layer 9 (e.g., a silicon or Si doped DLC alloy) deposited using TMS functions as a barrier layer to prevent certain impurities from getting into or out of the substrate. Moreover, when TMS is used in the deposition process of underlying anchor layer 9, the Si (silicon) in layer 9 helps to enable overlying DLC inclusive layer 10 to better bond and/or adhere to low-E arrangement 2–7 via anchor layer 9.

Surprisingly, it has also been found that the use of anchor DLC inclusive layer 9 (e.g., deposited via TMS gas) provides a more continuous/contiguous coating on a substrate surface at very thin thicknesses as compared to a DLC inclusive layer deposited using $C_2H_2$ (acetylene) gas directly on glass. As a result, anchor layer 9 (which is optional herein, but preferred in certain embodiments) can be deposited first directly on layer 7 at a relatively thin thickness, and the overlying layer 10 need not be as thick as would otherwise be required. In general, the thinner the layer 10, the higher the transmission of the overall coating system. Moreover, the provision of anchor layer 9 may enable improved yields to be achieved, as the occurrence of pinholes in the protective coating system 15 is less likely.

Still referring to the FIG. 2(a) embodiment, in embodiments where DLC inclusive layer 10 is formed on the substrate using a $C_2H_2$ (acetylene) inclusive precursor or feedstock gas and underlying DLC inclusive layer 9 is formed on the substrate using at least a TMS (tetramethylsilane) inclusive precursor or feedstock gas, the layers 9 and 10 tend to intermix with one another during the deposition process. Thus, there may not be a clear line delineating or separating the two layers 9 and 10 in the final product due to this intermixing (i.e., ion mixing) of the material from the two layers. However, for purposes of simplicity, the two layers 9 and 10 are referred to and illustrated herein as separate layers due to the different deposition processes (e.g., gases and/or energies) used in their respective formations.

It has been found that the outer DLC inclusive layer 10 formed using a hydrocarbon gas, such as $C_2H_2$ (acetylene), inclusive precursor or feedstock tends to have a greater hardness and density than does underlying DLC inclusive layer 9 formed using a TMS (tetramethylsilane) inclusive precursor or feedstock gas. For example, in certain exemplary embodiments of this invention, overlying layer 10 may have an average hardness (measured via a nano-indentation hardness measuring technique) of from about 45–85 GPa, more preferably from about 50–70 GPa, and most preferably from about 55–60 GPa. Meanwhile, underlying DLC inclusive layer 9 may have an average hardness of from about 10–35 GPa, and more preferably from about 15–30 GPa. Thus, the overlying layer 10 may be harder than the underlying layer 9 in certain embodiments, so as to make the end product more scratch and/or abrasion resistant. Using a nano-indentation hardness measuring technique, the final protective coating system 15, including layers 9–11, may have a hardness of at least about 10 GPa, more preferably from about 25–60 GPa, and even more preferably from about 30–45 GPa, which is at a hardness value between the respective hardnesses of the two DLC inclusive layers 9 and 10.

Thus, protective coating system 15 includes silicon (Si) in DLC inclusive layer 9 which functions to improve the bonding characteristics of overlying and harder DLC inclusive layer 10 to the underlying low-E system (e.g., via layer 7). For example, when layer 7 includes silicon nitride, the silicon (Si) in layer 9 enables excellent bonding of the DLC inclusive protective layer system 15 to the underlying low-E arrangement including layers 2–7. While the Si in layer 9 improves the bonding of layer 10 to the underlying substrate 1 (or layer 7), it is preferred that less Si be provided in layer 10 than in layer 9 because the provision of Si in a DLC inclusive layer may result in decreased scratch resistance and/or decreased hardness. Layer 10 may or may not include Si in different embodiments of this invention. While layer 9 allows for improved bonding to the substrate and underlying low-E arrangement of layers 2–7, the provision of DLC and some $sp^3$ carbon-carbon bonds therein allows this anchor layer 9 to have rather high hardness values so as to render the resulting product more durable and thus resistant to scratching, abrasions, chemicals, and the like.

In the FIG. 2(a) embodiment, anchor or intermediate DLC inclusive layer 9 may be from about 10 to 250 angstroms (Å) thick, more preferably from about 10 to 150 angstroms thick, and most preferably from about 30–50 angstroms thick; while outer DLC inclusive layer 10 may be from about 10 to 250 angstroms thick, more preferably from about 10 to 150 angstroms thick, and most preferably about 30–60 angstroms (Å) thick. FAS inclusive layer 11 may be from about 5–80 angstroms thick, more preferably from about 20–50 angstroms thick. However, these thicknesses are not limiting and the layers may be of other appropriate thicknesses in certain embodiments of this invention.

In certain embodiments, layer 10 may have an approximately uniform distribution of $sp^3$ carbon-carbon bonds throughout a large portion of its thickness, so that much of the layer has approximately the same density. In such embodiments, layer 9 may include a lesser percentage of $sp^3$ carbon-carbon bonds near the interface with substrate 1, with the percentage or ratio of $sp^3$ carbon-carbon bonds increasing throughout the thickness of the coating system 15 toward the outermost surface of layer 10. In overlying DLC inclusive layer 10, at least about 40% (more preferably at least about 60%, and most preferably at least about 80%) of the carbon-carbon bonds in the layer are of the $sp^3$ carbon-carbon type.

It is believed that the presence of $sp^3$ carbon-carbon bonds in layer 10 increases the density and hardness of the coating system, thereby enabling it to satisfactorily function in automotive environments. Layer 10 may or may not include s carbon-carbon bonds in different embodiments, although formation of $sp^2$ carbon-carbon bonds is likely in both layers 9 and 10.

Protective DLC inclusive layer system 15 may be hydrophobic in certain embodiments of this invention, hydrophillic in other embodiments of this invention, and/or neutral (neither hydrophobic nor hydrophillic) in other embodiments of this invention, depending upon the desired application. When it is desired to provide a hydrophobic coating system, in order to improve the hydrophobic nature of coating system 15 atoms in addition to carbon (C) may be provided in at least overlying layer 10 in different amounts in different embodiments. For example, in certain embodiments of this invention, layer 10 (taking the entire layer thickness, or only a thin 10A thick layer. portion thereof into consideration) may include in addition to the carbon atoms of the $sp^3$ carbon-carbon bonds, by atomic percentage, from about 0–20% Si (more preferably from about 0–10%), from about 0–20% oxygen (O) (more preferably from about 0–15%), and from about 5–60% hydrogen (H) (more preferably from about 5–35% H). Optionally, layer 10 may include from about 0–10% (atomic percentage) fluorine (F) (more preferably from about 0–5% F) in order to further enhance hydrophobic characteristics of the coating (especially in the FIG. 2(*b*) and 3 embodiments). In general, the provision of H in layer 10 reduces the number of polar bonds at the coating's surface, thereby improving the coating system's hydrophobic properties.

In certain embodiments, the outermost layer portion (e.g., 5–15 angstrom thick outermost or exterior layer portion) of layer 10 may include additional H and/or F atoms for the purpose of increasing the coating system's hydrophobic qualities (especially in the FIG. 2(*b*) and 3 embodiments). In such embodiments, the deposition of additional H atoms near layer 10's surface results in a more passive or non-polar coating proximate the surface thereof.

Two exemplary protective DLC inclusive hydrophobic coating systems 15 on a glass substrate (absent layers 2–7) were made and tested according to the FIG. 2(*a*) embodiment of this invention, as follows.

For the first coated article (sample #1), DLC inclusive layers 9 and 10 were deposited on a soda-lime-silica glass substrate 1 using a linear ion beam deposition source (see FIGS. 5–6) in the following manner. TMS feedstock gas (50 sccm) was used at 1,500 Volts to deposit layer 9, while $C_2H_2$ feedstock gas (100 sccm) was used at 3,000 Volts to deposit layer 10 directly on top of layer 9. The underlying substrate was maintained at about 70 to 80 degrees F during the deposition process. The scan speed for each of these was 36–50 in./minute. Each of layers 9 and 10 was less than 50 angstroms thick (likely from about 20–50 angstroms thick).

Sample #2 was made in the same manner as sample #1, except that 750 Volts were used in depositing layer 9 (the same 3,000 Volts were used for layer 10). Chart 1 below lists the measured characteristics of the substrates 1 coated with layers 9 and 10, prior to deposition of FAS layer 11, for sample #s 1 and 2 of the FIG. 2(*a*) embodiment (absent layers 2–7).

| Initial Contact Angle θ | Angle θ @ 25 Taber Cycles | @ 300 | @ 1,000 |
|---|---|---|---|
| #1 | 95° | 104° | 103° | 97° |
| #2 | 95° | 104° | N/A | 96° |

As can be seen in Chart 1 above, each of these coated articles (substrate with DLC inclusive layers 9 and 10 thereon, but no FAS layer) had an initial contact angle θ of about 95 degrees. After being subjected to 25 cycles of a Taber abrasion test, each had a contact angle of about 104 degrees, and after being subject to 1,000 cycles of the Taber abrasion test the articles had contact angles of 97 and 96 degrees, respectively.

An FAS layer 11 was then deposited on top of a layer 10 as shown in the FIG. 2(*a*) embodiment of this invention. Layer 11 was applied by physically rubbing it onto the exterior surface of layer 10. The measurements from this coated article (i.e., sample #3 including each of layers 9, 10 and 11 on soda-lime-silica glass substrate 1) are set forth below in Chart 2.

| Initial Contact Angle θ | Angle θ @ 25 Taber Cycles | @ 300 | @ 1,000 |
|---|---|---|---|
| #1 | 109° | 106° | 100° | 95° |

As can be seen by comparing the results in Chart 2 (with optional FAS layer 11) to the results of Chart 1 (without FAS layer 11), the provision of FAS layer 11 improved at least the initial contact angle of the resulting coated article. Charts 1 and 2 show that the addition of FAS layer 11 resulted in the initial contact angle improving from about 95 degrees to about 109 degrees. Thus, hydrophobic properties of the article were improved with the addition of FAS inclusive layer 11.

In certain embodiments of this invention (in both FAS and non-FAS embodiments), after 300 taber cycles the contact angle is preferably at least about 90 degrees, more preferably at least about 95 degrees. In a similar manner, after 1,000 tabler cycles the contact angle is preferably at least about 80 degrees, more preferably at least about 90 degrees.

FIG. 2(*b*) illustrates another embodiment of this invention, which is the same as the FIG. 2(*a*) embodiment except that FAS inclusive layer 11 is not provided. Thus, FAS inclusive layer 11 is clearly optional. In this FIG. 2(*b*) embodiment, the provision of DLC inclusive layers 9 and 10 to make up DLC inclusive protective layer system 15 enables the underlying low-E arrangement.of layers 2–7 to be protected against scratching, abrasions, etc. Still further, the protective layer system 15 according to this embodiment may or may not be hydrophobic in different embodiments of this invention.

Figure 2B:
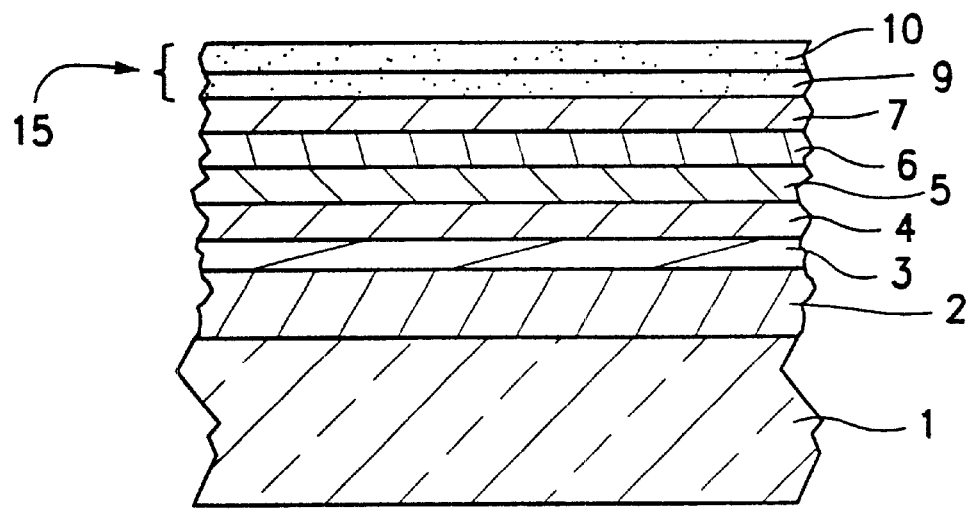
FIG. 2(b) is a side cross sectional view of a coated article according to another embodiment of this invention, wherein a substrate is provided with a low-E coating system thereon including a pair of protective DLC inclusive layers.
Figure 3:
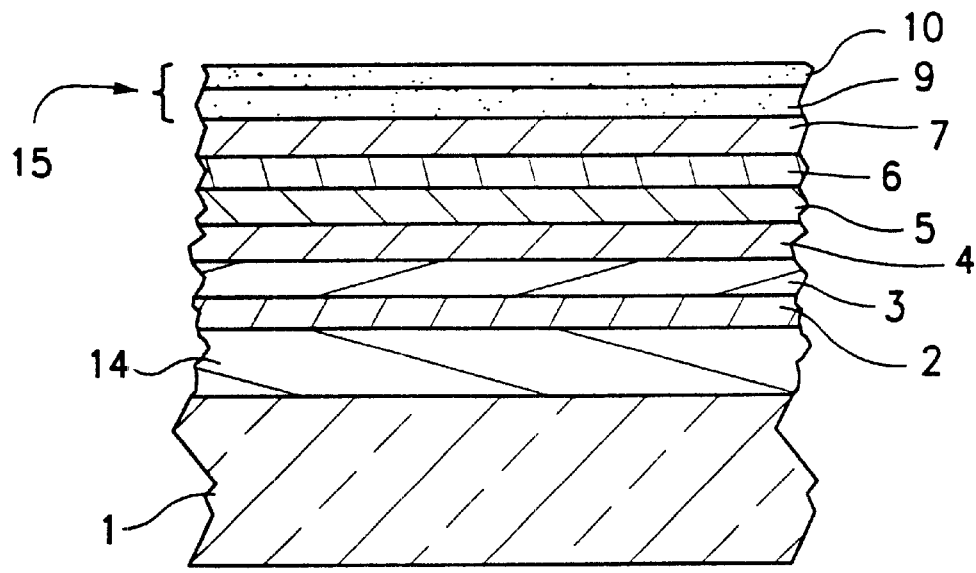
FIG. 3 is a side cross sectional view of a coated article according to another embodiment of this invention, wherein a substrate is provided with a low-E coating system thereon according to any of the FIG. 1, 2(a) or 2(b) embodiments and an index matching layer is provided between the substrate and the low-E coating system in order to further reduce visible reflections.

FIG. 3 illustrates yet another embodiment of this invention which is the same as the FIG. 2(*b*) embodiment, except that an index matching layer 14 is provided between layer 2 and substrate 1. The purpose of index matching layer 14 is to reduce reflections off of the coated article by approximately matching the respective indices of refraction of substrate 1 and layer 2. In an exemplary embodiment of this invention, index matching layer 14 may be of or include silicon oxynitride ($SiO_xN_y$), silicon oxide, silicon nitride, or any mixture thereof. Layer 14 may be deposited to a thickness of from about 50 to 1,000 Å (more preferably from about 100 to 500 Å) in certain embodiments, preferably via sputtering.

In variations of the embodiments of FIGS. 2(a), 2(b) and 3 described above, DLC inclusive layer 9 need not be included (i.e., layer 9 is optional in each of the aforesaid embodiments). Thus, in any of these embodiments, a single DLC inclusive layer 10 may be provided under optional FAS inclusive layer 11. In still further embodiments, one or more intermediate layer(s) (e.g., of metal oxide) (not shown) may be provided between layer 10 and low-E layering arrangement 2–7.

Referring to the different embodiments of FIGS. 1–3, DLC inclusive protective coating system 15 is at least about 75% transparent to or transmissive of visible light rays, preferably at least about 85%, and most preferably at least about 95%. In certain embodiments, the entire coated article of any of the FIGS. 1–3 embodiments may be at least about 75% transmissive to visible light.

When substrate 1 is of glass, it may be from about 1.0 to 5.0 mm thick, preferably from about 2.3 to 4.8 mm thick, and most preferably from about 3.7 to 4.8 mm thick. In certain embodiments, another advantage of protective coating system 15 is that the ta-C (e.g., in layers 9 and/or 10) therein may reduce the amount of soda (e.g., from a soda-lime-silica glass substrate 1) that can reach the surface of the coated article and cause stains/corrosion. In such embodiments, substrate 1 may be soda-lime-silica glass and include, on a weight basis, from about 60–80% $SiO_2$, from about 10–20% $Na_2O$, from about 0–16% CaO, from about 0–10% $K_2O$, from about 0–10% MgO, and from about 0–5% $Al_2O_3$. Iron and/or other additives may also be provided in the glass composition of the substrate 1. In certain other embodiments, substrate 1 may be soda lime silica glass including, on a weight basis, from about 66–75% $SiO_2$, from about 10–20% $Na_2O$, from about 5–15% CaO, from about 0–5% MgO, from about 0–5% $Al_2O_3$, and from about 0–5% $K_2O$. Most preferably, substrate 1 is soda lime silica glass including, by weight, from about 70–74% $SiO_2$, from about 12–16% $Na_2O$, from about 7–12% CaO, from about 3.5 to 4.5% MgO, from about 0 to 2.0% $Al_2O_3$, from about 0–5% $K_2O$, and from about 0.08 to 0.15% iron oxide. Soda lime silica glass according to any of the above embodiments may have a density of from about 150 to 160 pounds per cubic foot (preferably about 156), an average short term bending strength of from about 6,500 to 7,500 psi (preferably about 7,000 psi), a specific heat (0–100 degrees C.) of about 0.20 Btu/lbF, a softening point of from about 1330 to 1345 degrees F., a thermal conductivity of from about 0.52 to 0.57 Btu/hrftF, and a coefficient of linear expansion (room temperature to 350 degrees C.) of from about 4.7 to $5.0 \times 10^{-6}$ degrees F. Also, soda lime silica float glass available from Guardian Industries Corp., Auburn Hills, Mich., may be used as substrate 1. Any such aforesaid glass substrate 1 may be, for example, green, blue or grey in color when appropriate colorant(s) are provided in the glass in certain embodiments.

In certain other embodiments of this invention, substrate 1 may be of borosilicate glass, or of substantially transparent plastic, or alternatively of ceramic. In certain borosilicate embodiments, the substrate 1 may include from about 75–85% $SiO_2$, from about 0–5% $Na_2O$, from about 0 to 4% $Al_2O_3$, from about 0–5% $K_2O$, from about 8–15% $B_2O_3$, and from about 0–5% $Li_2O$.

In still further embodiments, an automotive window (e.g. windshield or side window) including any of the above glass substrates laminated to a plastic substrate may combine to make up substrate 1, with the low-E coating system(s) [see layers 2–15] of any of the FIGS. 1–3 embodiments provided on the outside surface of such a window. In other embodiments, substrate 1 may include first and second glass sheets of any of the above mentioned glass materials laminated to one another, for use in window (e.g. automotive windshield, residential window, commercial architectural window, automotive side window, vacuum IG window, automotive backlight or back window, etc.) and other similar environments.

The low-E coating system (layers 2–15) of any of the embodiments of FIGS. 1–3 may be provided on any surface of the substrate in such applications. For example, in vehicle applications (rear vehicle window adjacent a vehicle back seat; front seat vehicle window; vehicle backlite; vehicle windshield; etc.), the low-E coating system [layers 2–15 of any of the FIGS. 1–3 embodiments] may be provided on the exterior surface of the substrate 1 so as to be exposed to the environmental elements surrounding the vehicle; or alternatively may be provided on the interior surface of the substrate so as to be adjacent the interior of the vehicle. Depending upon which surface of the substrate the low-E coating is located, any of a hydrophobic, hydrophillic or neutral protective DLC inclusive system 15 may be provided as desired.

In hydrophobic embodiments where the DLC in protective system 15 is provided in a hydrophobic manner, it is noted that hydrophobic performance of the system of any of the FIGS. 1–3 embodiments is a function of contact angle $\theta$, surface energy $\gamma$, tilt angle $\beta$, and/or wettability or adhesion energy W.

Figure 4A:
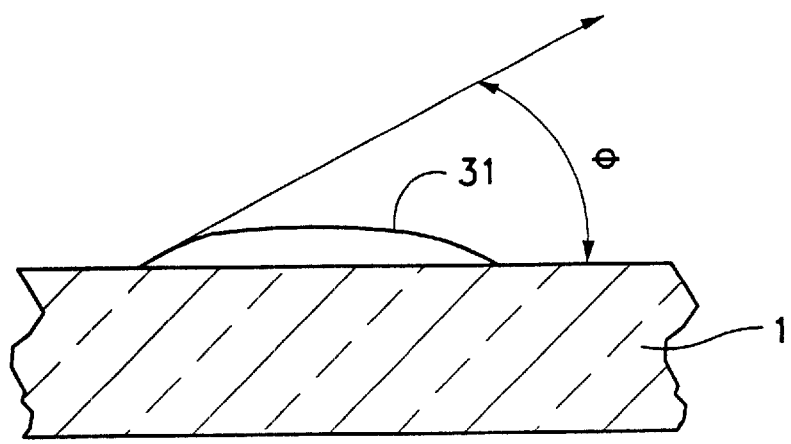
FIG. 4(a) is a side cross sectional partially schematic view illustrating a low contact angle θ of a water drop on a glass substrate.
Figure 4B:
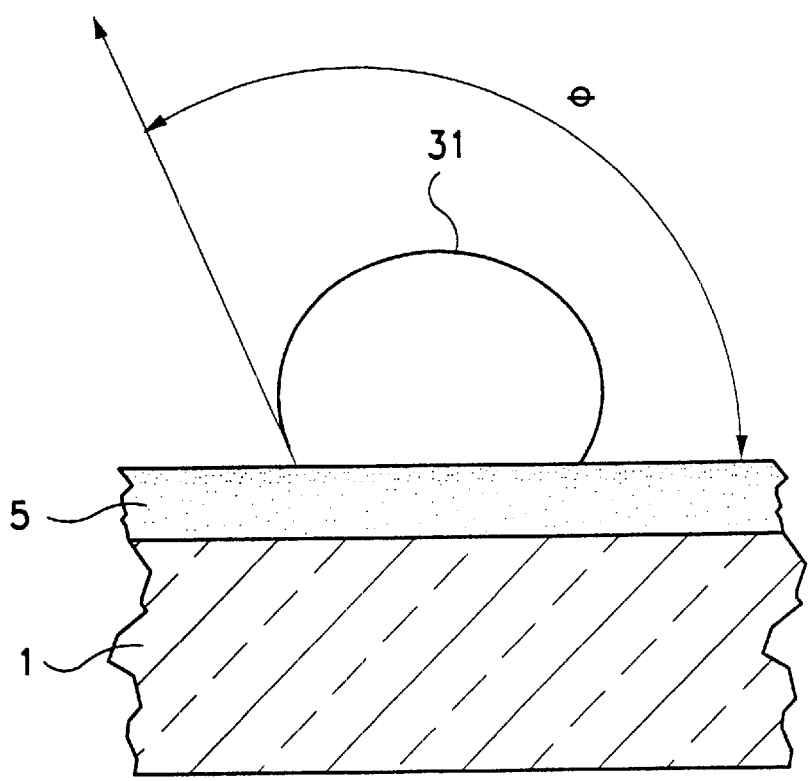
FIG. 4(b) is a side cross sectional partially schematic view illustrating the coated article of any of the FIGS. 1–3 embodiments (when a hydrophobic system is desired) of this invention and the contact angle θ of a water drop thereon.

The surface energy $\gamma$ of a coating system may be calculated by measuring its contact angle $\theta$ (contact angle $\theta$ is illustrated in FIGS. 4(a) and 4(b)). FIG. 4(a) shows the contact angle of a drop on a substrate absent a hydrophobic embodiment of this invention, while FIG. 4(b) shows the contact angle of a drop on a substrate having a coating system thereon according to a hydrophobic embodiment of this invention (in FIG. 4(b) layers 2–7 are not shown for purposes of simplicity). A sessile drop 31 of a liquid such as water is placed on the coating as shown in FIG. 4(b). A contact angle $\theta$ between the drop 31 and underlying coating system (e.g., see layers 2–15 of any of the FIGS. 1–3 embodiments, with the DLC and/or FAS inclusive layers on the outside surface) appears, defining an angle depending upon the interface tension between the three phases in the point of contact. Generally, the surface energy $\gamma_C$ of a coating system can be determined by the addition of a polar and a dispersive component, as follows: $\gamma_C = \gamma_{CP} + \gamma_{CD}$, where $\gamma_{CP}$ is the coating's polar component and $\gamma_{CD}$ the coating's dispersive component. The polar component of the surface energy represents the interactions of the surface which is mainly based on dipoles, while the dispersive component represents, for example, van der Waals forces, based upon electronic interactions. Generally speaking, the lower the surface energy $\gamma_C$ of coating system 15, the more hydrophobic the coating and the higher the contact angle $\theta$.

Adhesion energy (or wettability) W can be understood as an interaction between polar with polar, and dispersive with dispersive forces, between the coating system and a liquid thereon such as water. $\gamma^P$ is the product of the polar aspects of liquid tension and coating/substrate tension; while $\gamma^D$ is the product of the dispersive forces of liquid tension and coating/substrate tension. In other words, $\gamma^P = \gamma_{LP} * \gamma_{CP}$; and $\gamma^D = \gamma_{LD} * \gamma_{CD}$; where $\gamma_{LP}$ is the polar aspect of the liquid (e.g. water), $\gamma_{CD}$ is the polar aspect of coating system; $\gamma_{LD}$ is the dispersive aspect of liquid (e.g. water), and $\gamma_{CD}$ is the dispersive aspect of the coating system. It is noted that adhesion energy (or effective interactive energy) W, using the extended Fowkes equation, may be determined by:

$W = [\gamma_{LP} * \gamma_{CP}]^{1/2} + [\gamma_{LD} * \gamma_{CD}]^{1/2} = \gamma_1 (1 + \cos\theta)$, where $\gamma_1$ is liquid tension and $\gamma$ is the contact angle. W of two materials is a measure of wettability indicative of how hydrophobic the coating system is.

When analyzing the degree of hydrophobicity of outermost layer/portion of the coating system (e.g., at layer(s) 8, 10, or 11) with regard to water, it is noted that for water $\gamma_{LP}$ is 51 mN/m and $\gamma_{LD}$ is 22 niN/m. In certain embodiments of this invention, the polar aspect $\gamma_{CP}$ of surface energy of layers 8, 10 and 11 is from about 0 to 0.2 (more preferably variable or tunable between 0 and 0.1) and the dispersive aspect $\gamma_{CD}$ of the surface energy of layers 8, 10 and 11 is from about 16–22 mN/m (more preferably from about 16–20 mN/m). Using the above-listed numbers, according to certain embodiments of this invention, the surface energy $\gamma_C$ of layer 8, 10 and/or 11 (and thus the corresponding coating system) is less than or equal to about 20.2 mN/m, more preferably less than or equal to about 19.5 mN/m, and most preferably less than or equal to about 18.0 mN/m; and the adhesion energy W between water and the coating system is less than about 25 mN/m, more preferably less than about 23 mN/m, even more preferably less than about 20 mN/m, and most preferably less than about 19 mN/m. These low values of adhesion energy W and the coating system's surface energy $\gamma_C$, and the high initial contact angles $\theta$ achievable, illustrate the improved hydrophobic nature of the coating systems according to different embodiments of this invention. While layers 8, 10 and/or 11 may (or may not) function to provide much of the hydrophobic nature of the protective coating system 15, optional underlying DLC inclusive layer 9 in certain embodiments improves the bonding characteristics of the system 15 to the substrate 1 (e.g., glass substrate) and layers 2–7, and yet still provides adequate hardness characteristics regarding the coating system as a whole.

The initial contact angle $\theta$ of a conventional glass substrate 1 with sessile water drop 31 thereon is typically from about 22–24 degrees, although it may dip as low as 17 or so degrees in some circumstances, as illustrated in FIG. 4(a). Thus, conventional glass substrates are not particularly hydrophobic in nature. When hydrophobicity is desired, to protective system 15 may be deposited in a manner so as to achieve a hydrophobic result in any of the manners discussed in the parent application. In such hydrophobic embodiments, the provision of system 15 on substrate 1 causes the contact angle $\theta$ to increase to the angles discussed herein, as shown in FIG. 4(b) for example, thereby improving the hydrophobic nature of the article. As discussed in Table 1 of 09/303,548, the contact angle $\theta$ of a ta-C DLC layer is typically less than 50 degrees. However, the makeup of certain hydrophobic DLC-inclusive protective coating systems 15 described herein enables the initial contact angle $\theta$ of the system relative to a water drop (i.e. sessile drop 31 of water) to be increased in certain embodiments to at least about 55 degrees, more preferably to at least about 80 degrees, still more preferably to at least about 100 degrees, even more preferably at least about 110 degrees, and most preferably at least about 125 degrees, thereby improving the hydrophobic characteristics of the DLC-inclusive coating system. An "initial" contact angle $\theta$ means prior to exposure to environmental conditions such as sun, rain, abrasions, humidity, etc.

In certain preferred embodiments of this invention, layers 2–7 are deposited on substrate 1 via a sputtering process (e.g., see the sputtering techniques discussed in the '321 and/or '933 patents, incorporated herein by reference). However, the layer(s) of protective DLC inclusive system 15 are preferably deposited over layers 2–7 via an ion beam deposition technique. Thus, different deposition techniques are preferably used to deposit layers 2–15 on substrate 1. However, it is noted that these deposition techniques are for purposes of example only and are not intended to be limiting; any suitable deposition technique(s) may be used in different embodiments of this invention.

Figure 5:
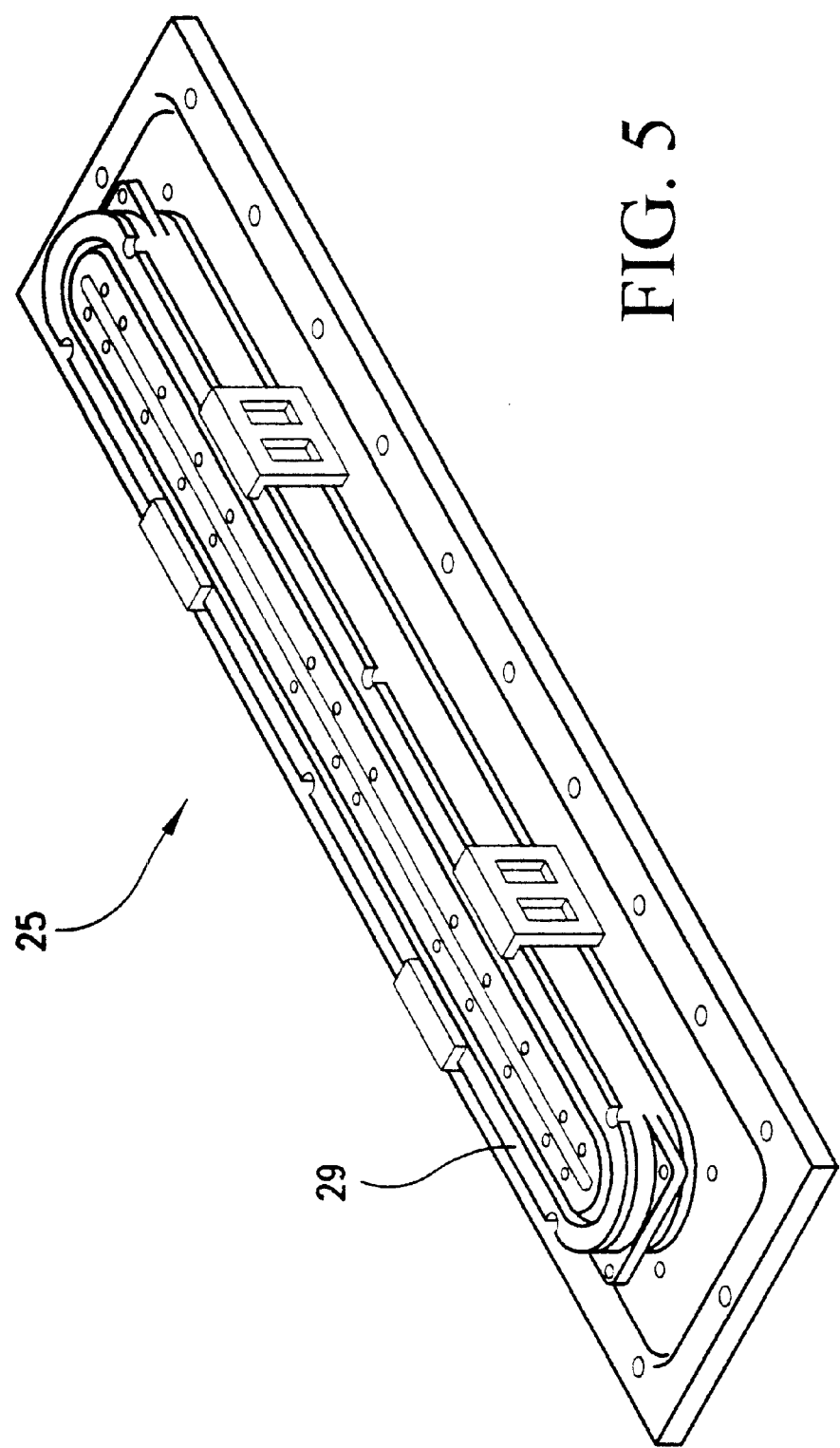
FIG. 5 is a perspective view of a linear ion beam source which may be used in any embodiment of this invention for depositing DLC inclusive layer(s) (it is noted that sputtering is a preferred method/technique for depositing the layers under the DLC inclusive layer(s)).
Figure 6:
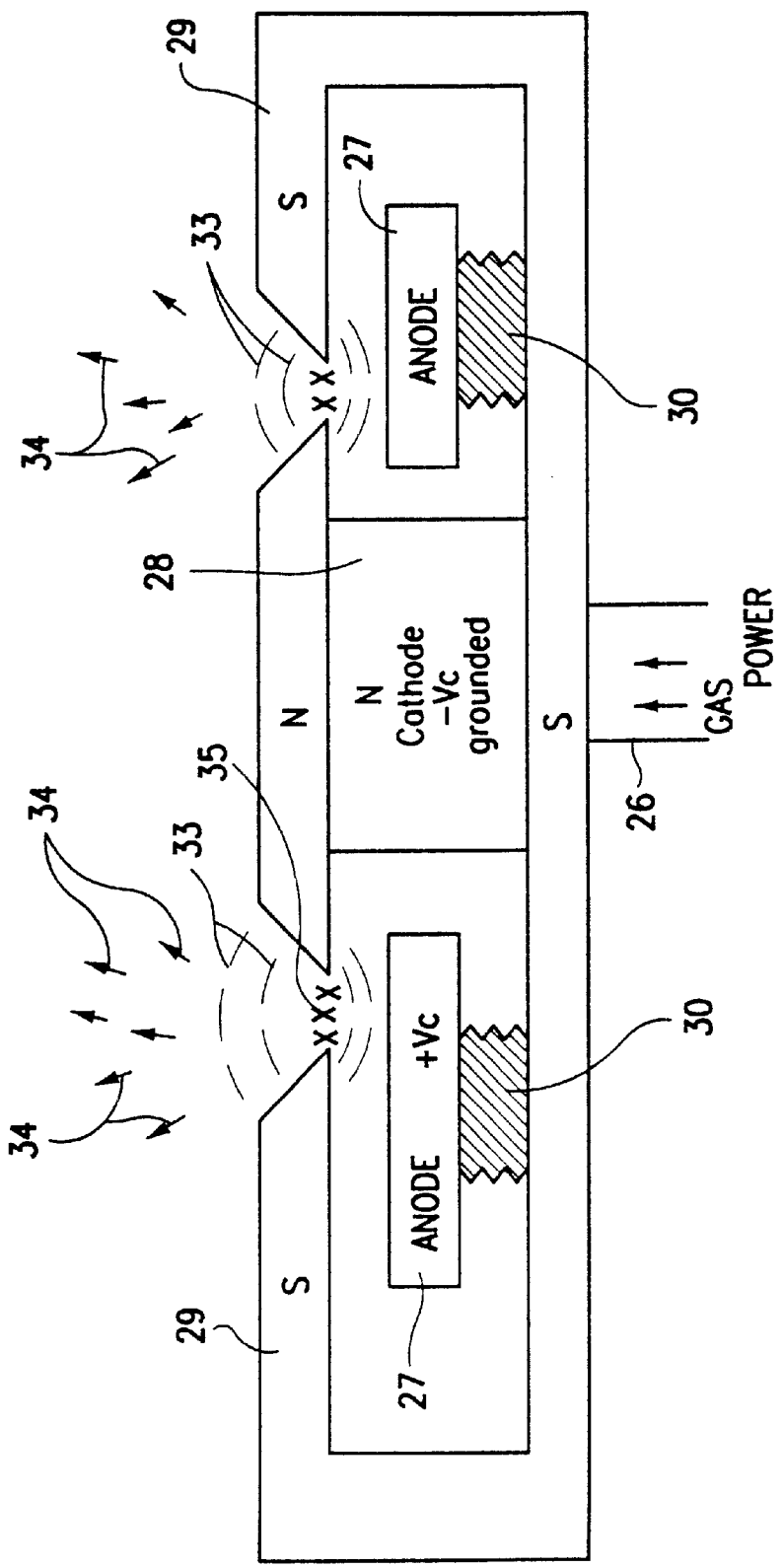
FIG. 6 is a cross sectional view of the linear ion beam source of FIG. 5.

FIGS. 5–6 illustrate an exemplary linear or direct ion beam source 25 which may be used to deposit layers 8, 9 and 10 of protective coating system 15, clean a substrate, or surface plasma treat a DLC inclusive coating system 15 with H and/or F according to different embodiments of this invention. Ion beam source 25 includes gas/power inlet 26, anode 27, grounded cathode magnet portion 28, magnet poles 29, and insulators 30. A 3 kV DC power supply may be used for source 25 in some embodiments. Linear source ion deposition allows for substantially uniform deposition of layers 9 and 10 as to thickness and stoichiometry. As mentioned above, FAS inclusive layer 11 is preferably not applied using ion beam technology (rubbing/buffing is a preferred deposition technique for layer 11) nor are layers 2–7, although they may be formed in such a manner in certain embodiments of this invention.

Ion beam source 25 is based upon a known gridless ion source design. The linear source is composed of a linear shell (which is the cathode and grounded) inside of which lies a concentric anode (which is at a positive potential). This geometry of cathode-anode and magnetic field 33 gives rise to a close drift condition. The magnetic field configuration further gives rise to an anode layer that allows the linear ion beam source to work absent any electron emitter. The anode layer ion source can also work in a reactive mode (e.g. with oxygen and nitrogen). The source includes a metal housing with a slit in a shape of a race track as shown in FIGS. 5–6. The hollow housing is at ground potential. The anode electrode is situated within the cathode body (though electrically insulated) and is positioned just below the slit. The anode can be connected to a positive potential as high was 3,000 or more volts (V). Both electrodes may be water cooled in certain embodiments. Feedstock/precursor gases, described herein, are fed through the cavity between the anode and cathode. The gas(es) used determines the make-up of the resulting layer(s) deposited on an adjacent substrate 1. Herein, a layer is deemed deposited "on" the substrate regardless of whether other layer(s) are located between that layer and the substrate. In other words, the term "on" herein covers both directly on and indirectly on with other layer(s) therebetween (e.g., layer system 15 is "on" substrate 1 in the FIGS. 1–3 embodiments even though other layers are provided therebetween).

The linear ion source also contains a labyrinth system that distributes the precursor gas (e.g., TMS (i.e., $(CH_3)_4Si$ or tetramethylsilane); acetylene (i.e., $C_2H_2$); 3MS (i.e., trimethyldisilane); DMS (i.e., dichloro-dimethylsilane); hexane; methane; HMDSO (i.e., hexamethyldisiloxane); TEOS (i.e., tetraethoxysilane), etc.) fairly evenly along its length and which allows it to supersonically expand between the anode-cathode space internally. The electrical energy then cracks the gas to prodluce a plasma within the source. The ions are expelled out at energies in the order of eVc–a/2 when the voltage is Vc–a. The ion beam emanating from the slit is approximately uniform in the longitudinal direction and has a Gaussian profile in the transverse direction. Exemplary ions 34 are shown in FIG. 6. A source as long as one meter may be made, although sources of different lengths are anticipated in different embodiments of this invention. Finally, electron layer 35 is shown in FIG. 6 completes the circuit thereby enabling the ion beam source to function properly.

An advantageous of the ion beam source of FIGS. 5–6 is that it can be used to deposit protective coating system 15 at temperatures e.g., from room temperature up to about 200 degrees C. In other words, it can be used to deposit system 15 over top of low-E layers 2–7 at temperatures which are low enough so that layers 2–7 are not significantly damaged during the deposition of DLC inclusive protective coating system 15.

In alternative embodiments of this invention, an ion beam source device or apparatus as described and shown in FIGS. 1–3 of U.S. Pat. No. 6,002,208 (hereby incorporated herein by reference in its entirety) may be used to deposit/form DLC inclusive layers 9, 10 on substrate 1 n accordance with either the FIG. 1, FIG. 2, or FIG. 3 embodiment of this invention. One or multiple such ion beam source devices may be used.

In certain embodiments, the same ion beam source 25 may be used to deposit both of layers 9 and 10; one after the other. In other embodiments of this invention two separate ion beam sources may be provided, a first for depositing layer 9 on substrate 1 over layers 2–7 and the second for depositing layer 10 over layer 9. After layers 9 and 10 are deposited, FAS inclusive layer 11 is preferably applied thereon via a rubbing process of any other suitable deposition technique.

Figure 7:
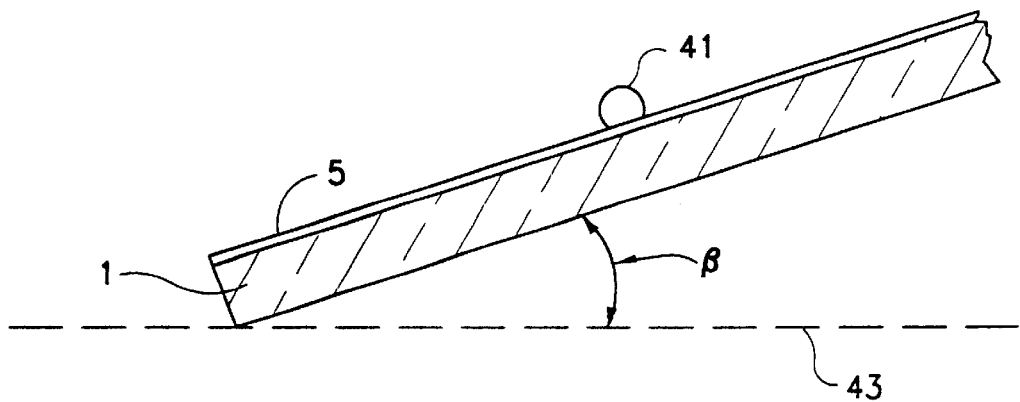
FIG. 7 is a diagram illustrating tilt angle as discussed herein in accordance with certain embodiments of this invention.

Referring to FIG. 7, tilt angle β characteristics associated with certain embodiments of this invention will be explained. In a hydrophobic coating, it is often desirable in certain embodiments to have a high contact angle θ (see FIG. 4(b)) in combination with a low tilt angle β. As shown in FIG. 7, tilt angle β is the angle relative to the horizontal 43 that the coated article must be tilted before a 30 μL (volume) drop 41 (e.g., of water) thereon begins to flow down the slant at room temperature without significant trail. A low tilt angle means that water and/or other liquids may be easily removed from the coated article upon tilting the same or even in high wind conditions. In certain embodiments of this invention, coated articles herein have an initial tilt angle β of no greater than about 30 degrees, more preferably no greater than about 20 degrees, and even more preferably no greater than about 10 degrees. In certain embodiments, the tilt angle does not significantly increase over time upon exposure to the environment and the like, while in other embodiments it may increase to some degree over time.

Referring to FIGS. 2(a) and 5–6, an exemplary method of depositing a low-E coating system on substrate 1 will now be described. This method is for purposes of example only, and is not intended to be limiting.

Initially, low-E layers 2–7 are sputtered onto substrate 1 using appropriate targets as described in any of U.S. Pat. Nos. 5,770,321 or 5,800,933, both incorporated herein by reference. After sputter deposition of layers 2–7, the deposition process for DLC inclusive layers 9 and 10 begins using a linear ion beam deposition technique via one or two ion beam source(s) as shown in FIGS. 5–6, or in FIGS. 1–3 of the '208 patent; with a conveyor having moved the substrate 1 with layers 2–7 thereon to a position under the ion beam source. The ion beam source functions to deposit a DLC inclusive layer 9 on substrate 1 over layers 2–7 so as to be in contact with layer 7 (e.g., layer 7 may be of silicon nitride to improve bonding between layers 7 and 9), with at least TMS being used as the precursor or feedstock gas fed through the source for the deposition of layer 9. Because of the Si in the TMS gas used in the source, the resulting layer 9 formed on substrate includes at least Si as well as DLC. The Si portion of DLC inclusive layer 9 enables good bonding of layer 9 to layer 7, and thus will also improve the bonding characteristics of layer 10 to the substrate 1.

After layer 9 has been formed, either the same or another ion beam source is used to deposit layer 10 over (directly on in preferred embodiments) layer 9. To deposit overlying DLC inclusive layer 10, another gas such as at least $C_2H_2$ is fed through the source so that the source expels the ions necessary to form layer 10 overlying layer 9 on substrate 1 and over layers 2–7. The $C_2H_2$ gas may be used alone, or in exemplary alternative embodiments the gas may be produced by bubbling a carrier gas (e.g. $C_2H_2$) through a precursor monomer (e.g. TMS or 3MS) held at about 70 degrees C. (well below the flashing point). Acetylene feedstock gas ($C_2H_2$) is used in certain embodiments for depositing layer 10 to prevent or minimize/reduce polymerization (layer 9 may be polymerized in certain embodiments) and to obtain an appropriate energy to allow the ions to penetrate the surface of layer 9 and subimplant therein, thereby causing layer 10 to intermix with layer 9 in at least an interface portion between the layers. The actual gas flow may be controlled by a mass flow controller (MFC) which may be heated to about 70 degrees C. In certain optional embodiments, oxygen ($O_2$) gas may be independently flowed through an MFC. The temperature of substrate 1 may be room temperature; an arc power of about 1000 W may be used; precursor gas flow may be about 25 sccm; the base pressure may be about $10^{-6}$ Torr. The optimal ion energy window for the majority of layers 9, 10 is from about 100–1,000 eV (preferably from about 100–400 eV) per carbon ion. At these energies, the carbon in the resulting layers 9 and/or 10 emulates diamond, and $sp^3$ C—C bonds form. However, compressive stresses can develop in ta—C when being deposited at 100–150 eV. Such stress can reach as high as 10 GPa and can potentially cause delamination from many substrates. It has been found that these stresses can be controlled and decreased by using an ion energy during the deposition process in a range of from about 200–1,000 eV.

As stated above, layers 9 and 10 intermix with one another at the interface between the two layers, thereby improving the bonding between the layers. At particle energies (carbon energies) of several hundred eV, a considerable material transport can take place over several atomic distances. This is caused by the penetration of fast ions and neutrals as well as by the recoil displacement of struck atoms. At sufficiently high particle energies and impact rates, there is an enhanced diffusion of the thermally agitated atoms near the film surface that occurs via the continuously produced vacancies. In the formation of ta—C:H, these effects can help improve film adhesion by broadening the interface (i.e., making it thicker, or making an interfacial layer between the two layers 9 and 10 due to atom mixing). Layers 9 and 10 are contiguous due to this intermixing, and this "smearing" between the layers enhances the adhesion of layer 10 to both layer 9 and thus the substrate 1.

High stress is undesirable in the thin interfacing portion of layer 9 that directly contacts the surface of layer 7 in the FIG. 2(a) embodiment. Thus, for example, the first 1–40% thickness (preferably the first 1–20% and most preferably the first 5–10% thickness) of layer 9 may optionally be deposited using high anti-stress energy levels of from about 200–1,000 eV, preferably from about 400–500 eV. Then, after this initial interfacing layer portion of layer 9 has been grown, the ion energy in the ion deposition process may be decreased (either quickly or gradually while deposition continues) to about 100–200 eV, preferably from about 100–150 eV, to grow the remainder of layer(s) 9 and/or layer 10. Thus, in certain embodiments, because of the adjustment in ion energy and/or gases during the deposition process, DLC inclusive layers 9, 10 may optionally have different densities and different percentages of $sp^3$ C—C bonds at different layer portions thereof (the lower the ion energy, the more $sp^3$ C—C bonds and the higher the density). Alternatively, the same energy may be used to deposit all of layers 9 and/or 10 in certain embodiments of this invention.

While direct ion beam deposition techniques are preferred in certain embodiments, other methods of deposition may also be used in different embodiments. For example, filtered cathodic vacuum arc ion beam techniques may be used to deposit layers 9, 10. Also, in certain embodiments, $CH_4$ may be used as a feedstock gas during the deposition process instead of or in combination with the aforesaid $C_2H_2$ gas.

Optionally, the outer surface of layer 10 may be treated using a plasma treatment by another source or grafting procedure (prior to formation of FAS layer 11). This technique using an ion beam source may remove certain polar functional groups at the outermost surface of layer 10, thereby altering the surface chemical reactivity (i.e. lowering surface energy) of layer 10. In such optional embodiments, after a conveyor has moved the DLC-coated substrate from the source station to a position under this another source, the plasma treatment by this source may introduce, e.g., hydrogen (H) atoms into the outermost surface of layer 10, thereby making layer 10's surface substantially non-polar and less dense than the rest of layer 10. These H atoms are introduced, because $H_2$ and/or $ArH_2$ feedstock gas is used by this source in certain embodiments. Thus, this source does not deposit any significant amounts of C atoms or Si atoms; but instead treats the outermost surface of layer 10 by adding H atoms thereto in order to improve its hydrophobic characteristics. This plasma treatment may also function to roughen the otherwise smooth surface. It is noted that $H_2$ feedstock gas is preferred in the ion beam source when it is not desired to roughen the surface of protective coating system 15, while $ArH_2$ feedstock gas is preferred in surface roughing embodiments. In other optional embodiments, this source may be used to implant F ions/atoms in to the outermost surface of layer 10.

After DLC inclusive layers 9 and 10 have been formed on substrate 1 and over layers 2–7, FAS inclusive layer 11 is applied thereto (e.g., by rubbing or otherwise applying this layer 11 in any other suitable manner).

Optionally, after FAS inclusive layer 11 has been formed on the substrate 1, the coated article may be heated (e.g., up to about 100 degrees C. in certain embodiments, or up to about 300 degrees C. in other embodiments). Surprisingly, it has been found that heating the coated article in such a manner improves the durability of FAS inclusive layer 11, and thus of the overall coating system. It is thought that such hearing may "cure" layer 11 or otherwise cause it to more completely bond to itself and/or layer 10.

Figure 10:
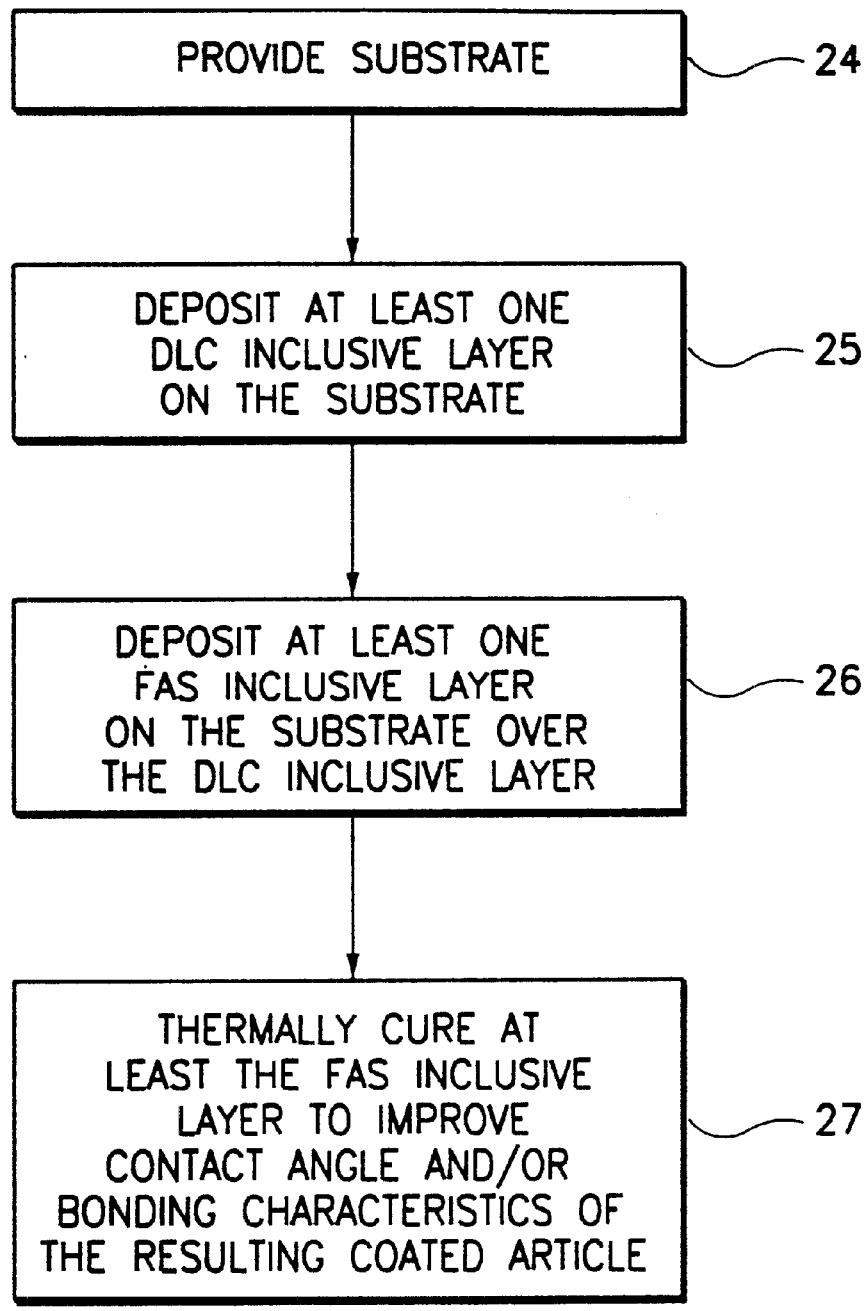
FIG. 10 is a flowchart illustrating how the FAS inclusive layer of the FIG. 2(a) embodiment may be thermally cured according to an embodiment of this invention.

In this regard, FIG. 10 is a flowchart illustrating certain steps taken in the manufacture of a coated article according to an embodiment of this invention. A substrate (e.g., glass, plastic, or ceramic substrate) is provided at step 24, with layers 2–7 thereon. At least one DLC inclusive protective layer (e.g., one or more of layers 8, 9, 10) is deposited on the substrate at step 25. Following formation of the DLC inclusive layer(s), an FAS compound inclusive layer (e.g., layer 11) is deposited on the substrate in step 26. The FAS inclusive layer is preferably deposited directly on the upper surface of a DLC inclusive layer in certain embodiments of this invention, but alternatively other layer(s) may be located between the DLC inclusive layer(s) and the FAS inclusive layer.

After the DLC and FAS inclusive layers have been deposited on the substrate, the entire coated article (or alternatively only the FAS inclusive layer) is subjected to heating for curing purposes in step 27. The heating may take place in any suitable oven or furnace, or alternatively may be implemented by an IR or any other type of localized heating device. This heating may be at a temperature of from about 50 to 300 degrees C., more preferably at a temperature of from about 70 to 200 degrees C., and even more preferably at a temperature of from about 70–100 degrees C. However, it is noted that as the heating time goes up, the required temperature goes down. Thus, for purposes of example only, the heating may be conducted at about 80 degrees C. for about 60 minutes (1 hour). Alternatively, the heating may be conducted at about 250 degrees C. for about 5 minutes, or at about 150 degrees C. for about 20 minutes. The time which the coated article is subjected to heating may range from about 20 seconds to 2 hours in certain embodiments of this invention, more preferably from about one (1) minute to one (1) hour, depending on the temperature used. In preferred embodiments of this invention, at least the FAS inclusive layer (and preferably the entire coated article) is heated at a temperature and for a period of time sufficient to achieve one or more of the advantages discussed above. Thus, when it is desired to keep the temperature(s) of layers 1–7 as low as possible, layer 11 need not be heated at all; or alternatively it may be heated at lesser temperature(s), e.g., 75 degrees C., or 40 degrees C., for longer periods of time than would be required at higher temperatures.

DLC inclusive protective coating system 15 according to different embodiments of this invention may have the following characteristics: coefficient of friction of from about 0.02 to 0.15; good abrasion resistance; an average density of from about 2.0 to 3.0 $g/cm^2$; permeability barrier to gases and ions; surface roughness less than about 0.5 nm; inert reactivity to acids, alkalis, solvents, salts and water; corrosion resistance; variable or tunable surface tension; tunable optical bandgap of from about 2.0 to 3.7 eV; IR transmission @ 10 $\mu$m of at least about 85%; UV transmission @ 350 nm of no greater than about 30%; tunable refractive index @ 550 nm [n=1.6 to 2.3; k=0.0001 to 0.1], permittivity @ GHz 4.5; an undoped electrical resistivity of at least about $10^{10}\Omega$/cm; dielectric constant of about 11@10 kHz and 4 @100 MHz; an electrical breakdown strength (V $cm^{-1}$) of about $10^6$; thermal coefficient of expansion of about $9\times10^{-6}$/C; and thermal conductivity of about 0.1 Wcm K.

Three examples of optional TMS-formed DLC inclusive anchor layers 9 are as follows. Each such layer 9 was deposited on a substrate using tetramethylsilane (TMS) and $O_2$ gas introduced within the linear ion beam source apparatus of FIGS. 5–6. All samples were of approximately the same thickness of about 750 A. A low energy electron flood gun was used to sharpen the spectral analysis conducted by x-ray photo electron spectroscopy (XPS) for chemical analysis. In XPS analysis of a layer 9, high energy x-ray photons (monochromatic) impinge on the surface of the layer. Electrons from the surface are ejected and their energy and number (count) measured. With these measurements, one can deduce the electron binding energy. From the binding energy, one can determine three things: elemental fingerprinting, relative quantity of elements, and the chemical state of the elements (i.e. how they are bonding). Components used in the XPS analysis include the monochromatic x-ray source, an electron energy analyzer, and electron flood gun to prevent samples from charging up, and an ion source used to clean and depth profile. Photoelectrons are collected from the entire XPS field simultaneously, and using a combination of lenses before and after the energy analyzer are energy filtered and brought to a channel plate. The result is parallel imaging in real time images. Sample Nos. 1–3 of DLC inclusive layer 9 were made and analyzed using XPS, which indicated that the samples included the following chemical elements by atomic percentage (H was excluded from the chart below).

| Sample No. | C | O | Si | F |
|---|---|---|---|---|
| 1 | 54.6% | 23.7% | 20.5% | 1.2% |
| 2 | 45.7% | 21.7% | 32.7% | 0% |
| 3 | 59.5% | 22.7% | 17.8% | 0% |

H was excluded from the XPS analysis because of its difficulty to measure. Thus, H atoms present in the coating Sample Nos. 1–3 of Chart 3 were not taken into consideration for these results. For example, if Sample No. 1 in Chart 3 included 9% H by atomic percentage, then the atomic percentages of each of the above-listed elements C, O, Si and F would be reduced by an amount so that all five atomic percentages totaled 100%. As can be seen, F is optional and need not be provided. Oxygen is also optional.

While TMS is described above as a primary precursor or feedstock gas utilized in the ion beam deposition source for depositing the optional underlying DLC inclusive layer 9, other gases may in addition or instead be used. For example, other gases such as the following may be used either alone, or in combination with TMS, to form layer 9: silane compounds such as TMS, diethylsilane, TEOS, dichlorodimethylsilane, trimethyldisilane, hexamethyldisiloxane, organosilane compounds; organosilazane compounds such as hexamethyldisilazane and tetramethyldisilazane; and/or organo-oxysilicon compounds such as tetramethyldisiloxane, ethoxytrimethylsilane, and organo-oxysilicon compounds. Each of these gases includes Si; and each of these gases may be used either alone to form layer 9, or in combination with one or more of the other listed gases. In certain embodiments, the precursor gas may also further include N, F and/or O in optional embodiments, for layer 9 and/or layer 10.

With regard to layer 10, a hydrocarbon gas such as acetylene is preferred for forming the layer. However, other gases such as ethane, methane, butane, cyclohexane, and/or mixtures thereof may also (or instead) be used in the ion beam source to form layer 10.

In certain embodiments of this invention (e.g., see FIGS. 1–3), protective coating system 15 (and thus the entire low-E coating system) has a contact angle of at least about 70°, more preferably at least about 80°, and even more preferably at least about 100° after a taber abrasion resistance test has been performed pursuant to ANSI Z26.1. The test utilizes 1,000 rubbing cycles of a coating system, with a load a specified in Z26.1 on the wheel(s). Another purpose of this abrasion resistance test is to determine whether the coated article is resistive to abrasion (e.g. whether hazing is less than 4% afterwards). ANSI Z26.1 is hereby incorporated into this application by reference.

FIGS. 8–9 illustrate the makeup of a protective coating system 15 including layers 9, 10, and 11 deposited on a substrate (absent layers 2–7) according to an embodiment of this invention. However, FIGS. 8 and 9 must be looked at together to span the entire coating system of layers 9–11. FIG. 8 shows the make-up with regard to C, O and Si for layers 9 and 10, while FIG. 9 shows the make-up with regard to C, O and Si for layer 11, throughout the respective thicknesses of these layers. X-ray Photoelectron Spectroscopy (XPS)/Electron Spectroscopy for Chemical Analysis (ESCA) was used to develop these graphs from sample products. This is used to characterize inorganic and organic solid materials. In order to perform such measurements on sample products as was done with regard to FIGS. 8–9, surfaces of the coating system were excited with Al monochromatic x-rays (1486.6 eV) and the photoelectrons ejected from the surface were energy analyzed. Low resolution analysis, i.e., a survey scan, can be used to identify elements (note that H, He, and F were not included in the analysis of FIGS. 8–9 even though at least H and/or F were present in the coating system) and establish the illustrated concentration table in units of atomic percentage (%). Detection limits were from about 0.1 to 0.05 atom %. High resolution analysis of individual photoelectron signals, i.e., C 1s, can be used to identify chemical bonding and/or oxidation state. Information on the surface is obtained from a lateral dimension as large as 1 mm diameter and from a depth of 0–10 $\mu$m. To acquire information from slightly greater depths, angle resolved measurements can be made.

FIG. 8 illustrates the makeup with regard to C, O and Si throughout the thicknesses of DLC inclusive layers 9 and 10 of protective coating system 15 of the FIG. 2(a) embodiment (i.e., no FAS layer was on layers 9 and 10 when this data was measured, so as to resemble FIG. 2(b)). Cycle number 1 is at the outer surface of layer 10, while cycle number 19 is believed to be within the underlying glass substrate 1 (remember, layers 9–10 were deposited directly on a glass substrate absent layers 2–7 for purposes of this test). Thus, it is believed that the interface between glass substrate 1 and underlying DLC inclusive layer 9 is at about cycle number 15 where the C % begins to significantly decrease. The "time" and "depth" columns refers to depth into layers 10, 9 from the exterior surface of layer 10 as compared to the depth into a conventional $SiO_2$ that would be achieved over the same time period. Thus, the angstrom depth illustrated in FIG. 8 is not the actual depth into layers 10, 9, but instead is how deep into a $SiO_2$ layer the sputtering would reach over the corresponding time. In FIG. 8, cycle number 1 may be affected from contamination of the outer surface of layer 10 and may be disregarded in effect. At least cycle numbers 2–6 refer or correspond to DLC inclusive layer 10 as evidenced by the high carbon amounts (i.e., greater than 94% C in layer 10 according to FIG. 8). Meanwhile, at least cycle numbers 9–13 refer or correspond to underlying DLC inclusive layer 9, as evidence by the lower C amounts shown in FIG. 8. Thus, it can be seen that layer 9 includes less C than layer 10, and is therefor less dense and less hard. Moreover, it can be seen that layer 9 includes more Si than layer 10 (and optionally more oxygen (O)). Cycle numbers 7–8 refer or correspond to the interface or intermixing layer portion between layers 9 and 10; as the coating system 15 at these thickness portions includes C and Si amounts between the amounts in respective layers 9 and 10. Thus, these cycle numbers 7–8 illustrate the intermixing (i.e., subimplantation of atoms from layer 10 in layer 9) or smearing between layers 9, 10 discussed herein. Meanwhile, cycle numbers 14–15 refer or correspond to the interfacial layer between layer 9 and the glass substrate, while cycle numbers 16–19 refer or correspond to the glass itself with its high $SiO_2$ content.

FIG. 9 illustrates a similar make-up, but of FAS layer 11 (i.e., with regard to only C, O and Si throughout the thickness of layer 11). The layer 11 analyzed in FIGS. 9–10 was of the $CF_3(CH_2)_2Si(OCH_3)_3$ type of FAS. Cycle number 1 is at the exterior surface of layer 11 where layer 11 meets the surrounding atmosphere, while cycle number 11 is believed to be in layer 11 near where the layer 11 meets the exterior surface of DLC inclusive layer 10. As can be seen by comparing FIGS. 8 and 9, the FAS inclusive layer 11 has much less carbon than does layer 10.

Figure 11:
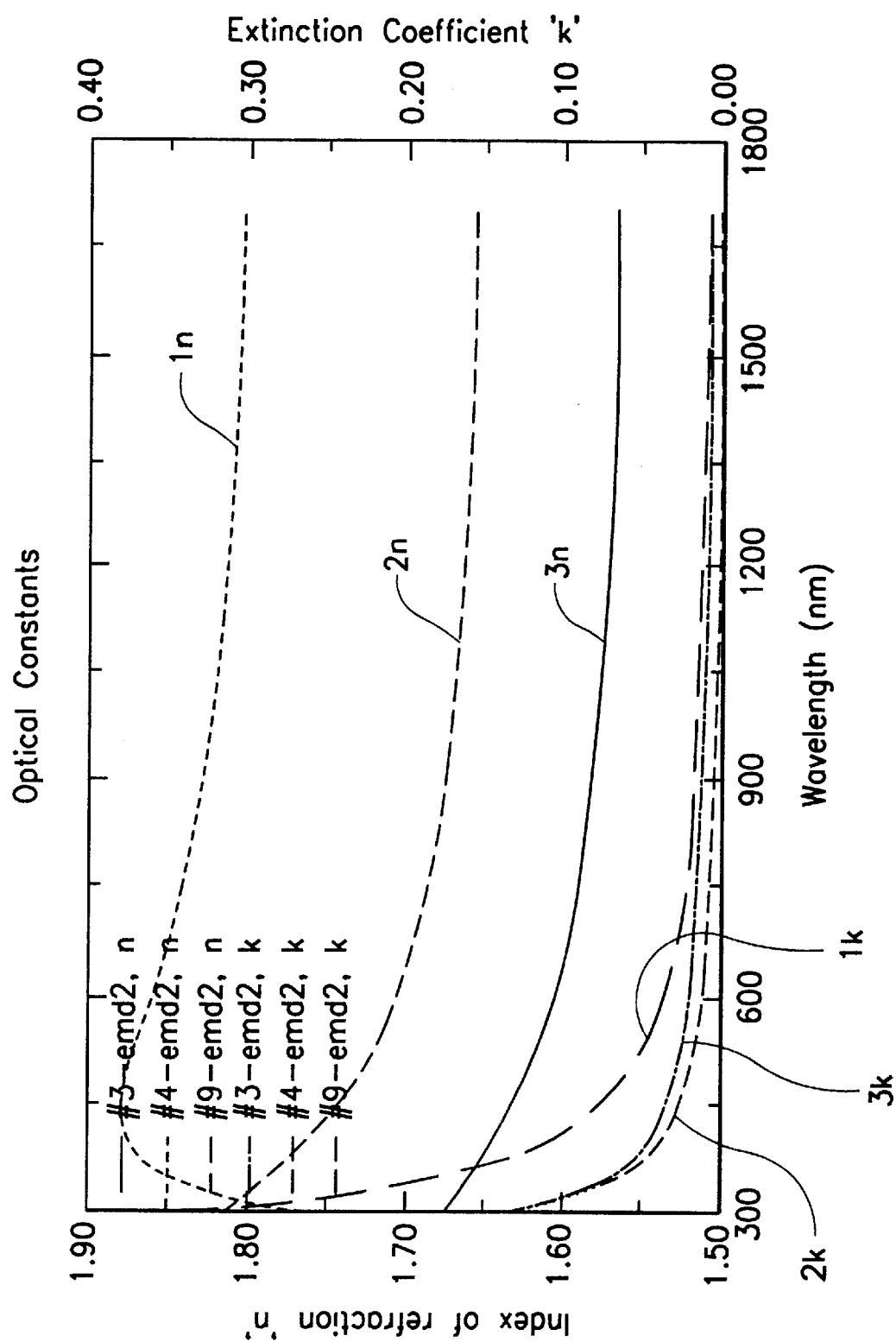
FIG. 11 is a graph illustrating certain "n" (index of refraction) and "k" values for certain DLC inclusive layers according to different embodiments of this invention.

FIG. 11 is a graph illustrating "n" and "k" values for different DLC inclusive layers according to certain embodiments of this invention. Curves 1n and 1k illustrate the "n" and "k" values for a DLC inclusive layer formed using $C_2H_2$ gas, respectively. Curves 2n and 2k illustrate the "n" and "k" values for a DLC inclusive layer formed using TMS gas, respectively. Curves 3n and 3k illustrate the "n" and "k" values for a DLC inclusive layer formed using $C_2H_2$/HMDSO gas, respectively. As can be seen, the DLC inclusive layer formed using $C_2H_2$ gas generally has higher "n" and "k" values than the other two DLC inclusive layers. The indices of refraction may be utilized so that a DLC inclusive layer adjacent a layer such as silicon nitride in certain embodiments of this invention does not result in too much undesirable reflection(s). In other words, different DLC inclusive layers may be utilized in an attempt to closely match indices of refraction of DLC layer(s) with indices of layers such as silicon nitride in order to reduce reflections off of the coated article.

As will be appreciated by those skilled in the art, coated articles according to different embodiments of this invention may be utilized in the context of automotive windshields, automotive side windows, automotive backlites (i.e., rear windows), architectural windows, residential windows, ceramic tiles, shower doors, and the like.

Once given the above disclosure, many other features, modifications, and improvements will become apparent to the skilled artisan. Such other features, modifications, and improvements are, therefore, considered to be a part of this invention, the scope of which is to be determined by the following claims.

What is claimed is:

1. A coated article comprising:
   a substrate;
   a low-E coating system provided on said substrate, said low-E coating system including at least one infrared (IR) reflecting layer and a protective substantially non-crystalline diamond-like carbon (DLC) inclusive layer provided in a position such that said IR reflecting layer is located between said substrate and said protective DLC inclusive layer; and
   wherein said DLC inclusive layer has an average density of at least about 2.4 $gm/cm^3$, wherein at least about 40% of carbon-carbon (C—C) bonds in said DLC inclusive layer are $sp^3$ carbon-carbon bonds, and wherein said DLC inclusive layer is from about 10–250 Å thick.

2. The coated article of claim 1, wherein said DLC inclusive layer includes highly tetrahedral amorphous carbon, and wherein the coated article has an initial contact angle θ of at least about 55 degrees.

3. The coated article of claim 1, where said low-E coating system is provided in a manner so that the coated article has a normal emissivity of no greater than about 0.10, a hemispherical emissivity of no greater than about 0.11, and a sheet resistance of no greater than about 10.0 ohms/square.

4. The coated article of claim 3, wherein said low-E coating system is provided in a manner so that the coated article has a normal emissivity of no greater than about 0.06, a hemispherical emissivity of no greater than about 0.07, and a sheet resistance of no greater than about 5.0 ohms/square, and wherein the coated article has an initial contact angle θ of at least about 80 degrees.

5. The coated article of claim 3, wherein the coated article has a visible transmittance of at least about 75%.

6. The coated article of claim 1, wherein said DLC inclusive layer is deposited via an ion beam deposition process over the IR reflecting layer in a manner such that the IR reflecting layer is maintained at temperature(s) no greater than about 200 degrees C during the ion beam deposition process for depositing the DLC inclusive layer.

7. The coated article of claim 1, wherein said low-E coating system further includes a first dielectric layer disposed between said IR reflecting layer and said substrate, and a second dielectric layer disposed between said IR reflecting layer and said DLC inclusive layer.

8. The coated article of claim 7, wherein said first dielectric layer comprises $TiO_2$ and said second dielectric layer comprises silicon nitride.

9. The coated article of claim 1, wherein said low-E coating system comprises, from said substrate outwardly, a layer system including:
   a) a dielectric layer;
   b) a dielectric layer comprising silicon nitride;
   c) a Ni inclusive layer;
   d) said IR reflecting layer including Ag;
   e) a Ni inclusive layer;
   f) a dielectric layer comprising silicon nitride; and
   g) said DLC inclusive layer.

10. The coated article of claim 9, wherein said low-E coating system comprises first and second DLC inclusive layers located outwardly of said IR reflecting layer.

11. The coated article of claim 10, wherein each of said first and second DLC inclusive layers includes highly tetrahedral amorphous carbon.

12. The coated article of claim 1, further comprising a fluoro-alkyl silane (FAS) compound inclusive layer located on said substrate such that said DLC inclusive layer is located between said FAS compound inclusive layer and said IR reflecting layer.

13. The coated article of claim 1, wherein said low-E coating system has an initial contact angle θ of at least about 55 degrees, and said DLC inclusive layer has an average hardness of at least about 10 GPa.

14. The coated article of claim 1, wherein said low-E coating system includes first and second DLC inclusive layers, said first DLC inclusive layer including silicon (Si) and being provided between said second DLC inclusive layer and said substrate; and
   wherein said second DLC inclusive layer is deposited in a manner so that at least a portion of said second DLC inclusive layer has a greater hardness and higher density than said first DLC inclusive layer.

15. The coated article of claim 14, wherein said low-E coating system further includes an FAS inclusive layer provided on said second DLC inclusive layer, so that said second DLC inclusive layer is located between said first DLC inclusive layer and said FAS inclusive layer.

16. The coated article of claim 1, wherein said coated article has an initial contact angle of at least about 80 degrees.

17. The coated article of claim 16, wherein said initial contact angle is at least about 100 degrees.

18. The coated article of claim 1, wherein said low-E coating system has a surface energy $\gamma_C$ of less than or equal to about 20.2 mN/m.

19. The coated article of claim 18, wherein said low-E coating system has a surface energy $\gamma_C$ of less than or equal to about 19.5 mN/m.

20. The coated article of claim 1, further comprising a fluoro-alkyl silane (FAS) compound inclusive layer located on said substrate such that said DLC inclusive layer is located between said FAS compound inclusive layer and said IR reflecting layer; and wherein said FAS compound includes at least one of: $CF_3(CH_2)_2Si(OCH_3)_3$; $CF_3(CF_2)_5(CH_2)_2Si(OCH_2CH_3)_3$; $CF_3(CH_2)_2SiCl_3$; $CF_3(CF_2)_7(CH_2)_2Si(OCH_3)_3$; $CF_3(CF_2)_5(CH_2)_2Si(OCH_3)_3$; $CF_3(CF_2)_7(CH_2)_2SiCl_3$; $CF_3(CF_2)_7(CH_2)_2SiCH_3Cl_2$; and $CF_3(CF_2)_7(CH_2)_2SiCH_3(OCH_3)_2$.

21. The coated article of claim 14, wherein said first DLC inclusive layer comprises more silicon (Si) than said second DLC inclusive layer.

22. The coated article of claim 21, wherein each of said first and second DLC inclusive layers include $sp^3$ carbon-carbon bonds.

23. The coated article of claim 1, wherein the coated article has a visible transmission of at least 70%.

24. The coated article of claim 1, wherein the low-E coating system has a sheet resistance ($R_s$) of no greater than about 10 ohms/square.

25. The coated article of claim 1, wherein at least about 60% of carbon-carbon (C—C) bonds in said DLC inclusive layer are $sp^3$ carbon-carbon bonds.

26. The coated article of claim 1, wherein the DLC inclusive layer further includes hydrogen.

27. The coated article of claim 1, wherein the DLC inclusive layer has an average density of from about 2.7 to 3.0 gm/cm$^3$.

28. The coated article of claim 1, wherein the DLC inclusive layer is from about 30–60 Å thick.

29. The coated article of claim 1, wherein the low-E coating system comprises a first dielectric layer, a metal or metal oxide layer, a layer comprising Ag, another metal or metal oxide layer, and a second dielectric layer, wherein the layer comprising Ag and the metal or metal oxide layers are all provided between the first and second dielectric layers.

30. A coated article comprising:

a glass substrate;

at least one dielectric layer on said substrate;

an IR reflecting layer on said substrate, wherein said dielectric layer is located between said IR reflecting layer and said substrate;

a hydrophobic coating system including diamond-like carbon (DLC), wherein said IR reflecting layer is located between said hydrophobic coating system and said substrate;

wherein said hydrophobic coating system has an initial contact angle θ with a drop of water of at least about 55 degrees; and wherein said hydrophobic coating system includes a layer comprising DLC that has an average density of at least about 2.4 gm/cm$^3$, wherein at least about 40% of carbon-carbon (C—C) bonds in said layer comprising DLC are $sp^3$ carbon-carbon bonds, and wherein said layer comprising DLC is from about 10–250 Å thick.

31. The coated article of claim 30, wherein said hydrophobic coating system further comprises at least one fluoro-alkyl silane (FAS) compound.

32. The article of claim 30, wherein said initial contact angle is at least about 80 degrees.

33. The coated article of claim 30, wherein the coated article has a visible transmission of at least 70%.

34. The coated article of claim 30, wherein the DLC inclusive layer further includes hydrogen.

35. A coated article comprising:

a glass substrate;

a multi-layer arrangement provided on said glass substrate, the multi-layer arrangement including at least one layer comprising Ag; and a protective diamond-like carbon (DLC) inclusive layer including tetrahedral amorphous carbon (ta—C) provided in a position such that said layer comprising Ag is located between said glass substrate and said protective DLC inclusive layer; and wherein said DLC inclusive layer has an average density of at least about 2.4 gm/cm$^3$, wherein at least about 40% of carbon-carbon (C—C) bonds in said DLC inclusive layer are $sp^3$ carbon-carbon bonds, and wherein said DLC inclusive layer is from about 10–250 Å thick.

36. The coated article of claim 35, wherein the coated article has a visible transmission of at least 70%.

37. The coated article of claim 35, wherein the multi-layer arrangement has a sheet resistance ($R_s$) of no greater than about 10 ohms/square.

38. The coated article of claim 35, wherein at least about 60% of carbon-carbon (C—C) bonds in said DLC inclusive layer are $sp^3$ carbon-carbon bonds.

39. The coated article of claim 35, wherein the DLC inclusive layer further includes hydrogen.

40. The coated article of claim 35, wherein the DLC inclusive layer has an average density of from about 2.7 to 3.0 gm/cm$^3$.

41. A coated article comprising:

a glass substrate;

a low-E coating system provided on said glass substrate, said low-E coating system including at least one infrared (IR) reflecting layer, first and second Si inclusive dielectric layers, and a protective substantially non-crystalline diamond-like carbon (DLC) inclusive layer;

wherein said first Si inclusive dielectric layer is located between said DLC inclusive layer and said IR reflecting layer; and wherein said DLC inclusive layer has an average density of at least about 2.4 gm/cm$^3$, wherein at least about 40% of carbon-carbon (C—C) bonds in said DLC inclusivel layer are $sp^3$ carbon-carbon bonds, and wherein said DLC inclusive layer is from about 10–250 Å thick.

42. The coated article of claim 41, wherein the coated article has a visible transmission of at least 70%.

43. The coated article of claim 41, wherein the low-E coating system has a sheet resistance ($R_s$) of no greater than about 10 ohms/square.

44. The coated article of claim 41, wherein at least about 60% of carbon-carbon (C—C) bonds in said DLC inclusive layer are $sp^3$ carbon-carbon bonds.

45. The coated article of claim 41, wherein the DLC inclusive layer further includes hydrogen.

46. The coated article of claim 41, wherein the DLC inclusive layer has an average density of from about 2.7 to 3.0 gm/cm$^3$.

47. The coated article of claim 41, wherein the low-E coating system comprises the first Si inclusive dielectric layer, a metal or metal oxide layer, a layer comprising Ag that is the IR reflecting layer, another metal or metal oxide layer, and the second Si inclusive dielectric layer, wherein the layer comprising Ag and the metal or metal oxide layers are all provided between the first and second Si inclusive dielectric layers.

48. A coated article comprising:

a glass substrate;

a coating provided on said glass substrate, said coating including at least one layer comprising Ag and at least two dielectric layers;

a protective diamond-like carbon (DLC) inclusive layer provided on said glass substrate in a position such that said layer comprising Ag is located between said glass substrate and said DLC inclusive layer; and wherein said DLC inclusive layer has an average density of at least about 2.4 gm/cm$^3$, wherein said DLC inclusive layer is hydrogenated, and wherein said DLC inclusive layer is from about 10–250 Å thick.

49. The coated article of claim 48, wherein the coated article has a visible transmission of at least 70%.

50. The coated article of claim 48, wherein the coating has a sheet resistance ($R_s$) of no greater than about 10 ohms/square.

51. The coated article of claim 48, wherein at least about 60% of carbon-carbon (C—C) bonds in said DLC inclusive layer are sp$^3$ carbon-carbon bonds.

52. The coated article of claim 48, wherein the DLC inclusive layer has an average density of from about 2.7 to 3.0 gm/cm$^3$.

53. The coated article of claim 48, wherein the DLC inclusive layer is from about 30–60 Å thick.

54. The coated article of claim 48, wherein the coating comprises the dielectric layer, a metal or metal oxide layer, a layer comprising Ag, another metal or metal oxide layer, and another or second dielectric layer, wherein the layer comprising Ag and the metal or metal oxide layers are all provided between the dielectric layers.

55. The coated article of claim 35, wherein the multi-layer arrangement comprises a first dielectric layer, a metal or metal oxide layer, the layer comprising Ag, another metal or metal oxide layer, and a second dielectric layer, wherein the layer comprising Ag and the metal or metal oxide layers are all provided between the first and second dielectric layers.

56. A coated article comprising:

a glass substrate supporting a coating system, wherein the coating system includes a layer comprising Ag located between at least first and second dielectric layers;

a layer comprising hydrogenated amorphous diamond-like carbon (DLC) provided on the glass substrate over the coating system, wherein the layer comprising DLC has an average density of at least about 2.4 gm/cm$^3$, wherein the layer comprising DLC has more sp$^3$ carbon-carbon bonds than sp$^2$ carbon-carbon bonds; and wherein the layer comprising DLC has an average hardness of at least about 10 GPa.

57. The coated article of claim 56, wherein the coating system has a sheet resistance of no greater than about 10 ohms/square, and the coated article has a visible transmission of at least about 70%.

\* \* \* \* \*